(12) United States Patent
Chiba et al.

(10) Patent No.: US 10,178,767 B2
(45) Date of Patent: Jan. 8, 2019

(54) RESIN COMPOSITION, PREPREG, LAMINATE, METALLIC FOIL CLAD LAMINATE, AND PRINTED CIRCUIT BOARD

(71) Applicant: MITSUBISHI GAS CHEMICAL COMPANY, INC., Tokyo (JP)

(72) Inventors: Tomo Chiba, Tokyo (JP); Hiroshi Takahashi, Tokyo (JP); Eisuke Shiga, Tokyo (JP); Yoshihiro Kato, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 252 days.

(21) Appl. No.: 14/647,272

(22) PCT Filed: Nov. 27, 2013

(86) PCT No.: PCT/JP2013/081841
§ 371 (c)(1),
(2) Date: May 26, 2015

(87) PCT Pub. No.: WO2014/084226
PCT Pub. Date: Jun. 5, 2014

(65) Prior Publication Data
US 2015/0319853 A1   Nov. 5, 2015

(30) Foreign Application Priority Data

Nov. 28, 2012 (JP) ................. 2012-260236

(51) Int. Cl.
| | |
|---|---|
| B32B 3/10 | (2006.01) |
| H05K 1/03 | (2006.01) |
| H05K 1/05 | (2006.01) |
| C08J 5/24 | (2006.01) |
| C08L 63/00 | (2006.01) |
| C08F 283/12 | (2006.01) |
| C08L 51/08 | (2006.01) |
| B32B 15/14 | (2006.01) |
| B32B 15/20 | (2006.01) |
| C08G 59/24 | (2006.01) |
| C08G 59/32 | (2006.01) |
| C08K 3/36 | (2006.01) |

(Continued)

(52) U.S. Cl.
CPC ........... *H05K 1/0353* (2013.01); *B32B 15/14* (2013.01); *B32B 15/20* (2013.01); *C08F 283/124* (2013.01); *C08G 59/245* (2013.01); *C08G 59/3218* (2013.01); *C08J 5/24* (2013.01); *C08K 3/36* (2013.01); *C08L 51/085* (2013.01); *C08L 63/00* (2013.01); *C08L 79/04* (2013.01); *H05K 1/056* (2013.01); *B32B 2260/021* (2013.01); *B32B 2260/046* (2013.01); *B32B 2262/101* (2013.01); *B32B 2264/102* (2013.01); *B32B 2307/202* (2013.01); *B32B 2307/206* (2013.01); *B32B 2307/3065* (2013.01); *B32B 2307/714* (2013.01); *B32B 2457/08* (2013.01); *C08G 73/0655* (2013.01); *C08J 2363/00* (2013.01); *C08J 2463/04* (2013.01); *C08J 2479/00* (2013.01); *C08J 2483/07* (2013.01); *C08K 5/315* (2013.01); *C08L 61/06* (2013.01); *C08L 79/085* (2013.01); *C08L 2203/20* (2013.01); *C08L 2205/035* (2013.01); *H05K 1/0366* (2013.01); *H05K 1/0373* (2013.01); *H05K 2201/012* (2013.01); *H05K 2201/0162* (2013.01); *H05K 2201/0209* (2013.01); *Y10T 428/24802* (2015.01); *Y10T 428/249921* (2015.04); *Y10T 428/2962* (2015.01); *Y10T 442/2951* (2015.04)

(58) Field of Classification Search
None
See application file for complete search history.

(56) References Cited

U.S. PATENT DOCUMENTS

| | | | | |
|---|---|---|---|---|
| 2009/0017316 A1* | 1/2009 | Kato | ........................ | C08L 79/04 428/447 |
| 2010/0233495 A1* | 9/2010 | Mizuno | .................... | C08J 3/243 428/462 |

(Continued)

FOREIGN PATENT DOCUMENTS

| | | |
|---|---|---|
| CN | 102124066 A | 7/2011 |
| CN | 102471561 A | 5/2012 |

(Continued)

OTHER PUBLICATIONS

Machine translation of JP2011-195673 retrieved on May 11, 2017.*
International search report issued with respect to application No. PCT/JP2013/081841, dated Mar. 11, 2014.
International preliminary report on patentability issued with respect to application No. PCT/JP2013/081841, dated Jun. 2, 2015.

*Primary Examiner* — Christopher M Polley
(74) *Attorney, Agent, or Firm* — Greenblum & Bernstein, P.L.C.

(57) ABSTRACT

An object of the present invention is to provide a resin composition that has a variety of properties required for a material for printed circuit boards such as high flame retardancy, and can attain a cured product having high moldability, high resistance against chemicals in a desmearing step, and a small coefficient of thermal expansion, a prepreg comprising the resin composition, a laminate including the prepreg, a metallic foil clad laminate including the prepreg, and a printed circuit board including the prepreg. A resin composition comprising an acrylic-silicone copolymer (A), a halogen-free epoxy resin (B), a cyanic acid ester compound (C) and/or a phenol resin (D), and an inorganic filler (E).

38 Claims, No Drawings

(51) Int. Cl.
  *C08L 79/04*   (2006.01)
  *C08G 73/06*   (2006.01)
  *C08L 61/06*   (2006.01)
  *C08L 79/08*   (2006.01)
  *C08K 5/315*   (2006.01)

(56) References Cited

U.S. PATENT DOCUMENTS

| | | |
|---|---|---|
| 2011/0159296 A1 | 1/2011 | Maenaka et al. |
| 2012/0095133 A1 | 4/2012 | Vyakaranam et al. |
| 2013/0101863 A1 | 4/2013 | Mabuchi et al. |
| 2013/0136930 A1 | 5/2013 | Kato et al. |
| 2013/0337269 A1 | 12/2013 | Ohtsuka et al. |
| 2014/0017502 A1 | 1/2014 | Kato et al. |

FOREIGN PATENT DOCUMENTS

| | | | |
|---|---|---|---|
| JP | S63-228649 A | | 9/1988 |
| JP | H02-228319 A | | 9/1990 |
| JP | H03-106960 A | | 5/1991 |
| JP | H07-206949 A | | 8/1995 |
| JP | 2000-080285 A | | 3/2000 |
| JP | 2002-088224 A | | 3/2002 |
| JP | 2003-502484 A | | 1/2003 |
| JP | 2003-531941 A | | 10/2003 |
| JP | 2006-193607 A | | 7/2006 |
| JP | 2006-193619 A | | 7/2006 |
| JP | 2009-35728 A | | 2/2009 |
| JP | 2010-44998 A | | 2/2010 |
| JP | 2010-100803 A | | 5/2010 |
| JP | 2011-195673 A | | 10/2011 |
| JP | 2011195673 A | * | 10/2011 |
| TW | 201111437 A1 | | 4/2011 |
| TW | 201204760 A1 | | 2/2012 |
| TW | 201233702 A1 | | 8/2012 |
| WO | 2000-079582 A1 | | 12/2000 |
| WO | 2001-083607 A1 | | 11/2001 |
| WO | 20111005925 A | | 1/2011 |
| WO | 20111132674 A1 | | 10/2011 |
| WO | 20121029690 A1 | | 3/2012 |
| WO | 20121099162 A1 | | 7/2012 |
| WO | 20121121224 A1 | | 9/2012 |

* cited by examiner

RESIN COMPOSITION, PREPREG, LAMINATE, METALLIC FOIL CLAD LAMINATE, AND PRINTED CIRCUIT BOARD

TECHNICAL FIELD

The present invention relates to a resin composition, a prepreg, a laminate, a metallic foil clad laminate, and a printed circuit board.

BACKGROUND ART

In recent years, enhancement of high integration, high function, and high dense packaging have been accelerated in semiconductors widely used in electronic apparatuses, communication apparatuses, and personal computers, and demands for properties of laminates for semiconductor plastic packages and high reliability thereof have been increased.

In particular, it has been strongly demanded that a reduction in the coefficient of thermal expansion in the planar direction of the laminate for semiconductor plastic packages and an enhancement in the resistance against chemicals of the laminate be satisfied at the same time.

Such a demand for the reduction in the coefficient of thermal expansion in the planar direction of the laminate comes from the following reason. When the difference in the coefficient of thermal expansion between a semiconductor element or a semiconductor plastic package and a laminate such as a printed circuit board for a semiconductor plastic package is large, a thermal impact applied to the laminate causes warpage in the laminate due to this difference in the coefficient of thermal expansion. This warpage causes connection deficits between the semiconductor element or the semiconductor plastic package and the laminate.

To solve such a problem, for example, Patent Literature 1 describes reducing the coefficient of thermal expansion of a cured product (laminate) prepared from a thermosetting resin composition by increasing the content of an inorganic filler. Patent Literature 2 describes use of a silicone rubber as a powder having rubber elasticity and fused silica as an inorganic filler to prepare a resin composition that can attain a laminate having high flame retardancy and low thermal expansion in the planar direction.

The demand for an enhancement in the resistance against chemicals of the laminate comes from the following reason. The process of preparing a laminate such as a printed circuit board includes steps during which the laminate is exposed to a variety of chemical solutions, such as etching, desmearing, and plating. If the laminate has low resistance against chemicals, it leads degradation of the laminate and a reduction in productivity. Specifically, when a laminate has insufficient resistance against chemicals, the plastic layer in the laminate elutes into the chemical solution to contaminate the chemical solution. The laminate is degraded by use of such a contaminated chemical solution.

If the chemical solution is frequently replaced to prevent such a degradation of the laminate, cost increases and the amount of production reduces, leading to a significant reduction in the productivity of the laminate.

In particular, the desmearing step uses a strong alkaline chemical to remove smears generated by mechanical drilling or laser drilling. In the laminate having insufficient resistance against chemicals, inner walls of through holes and the surface of the plastic layer as well as the smears elute to readily contaminate the chemical solution.

CITATION LIST

Patent Literature

Patent Literature 1: Japanese Patent Application Laid-Open No. 2000-080285
Patent Literature 2: Japanese Patent Application Laid-Open No. 2009-035728

SUMMARY OF INVENTION

Technical Problem

Unfortunately, when the amount of the inorganic filler to be filled is simply increased as in Patent Literature 1, it will result in a significant removal of the inorganic filler present in the inner walls of through holes and the surface of the plastic layer during the desmearing step, reducing the resistance against chemicals. In addition, the removed inorganic filler will contaminate the chemical solution more significantly.

Furthermore, when a silicone rubber is only used as in Patent Literature 2, insufficient resistance against chemicals of the silicone rubber itself causes removal of the silicone rubber during the desmearing step as the inorganic filler does, reducing the resistance against chemicals.

Furthermore, other methods of reducing the thermal expansion of the laminate by use of a silicone resin, a siloxane-modified resin, or an epoxy-modified silicone resin have been found, but any of these does not enhance resistance against chemicals satisfactorily. Accordingly, it has been demanded that a reduction in the coefficient of thermal expansion in the planar direction of the cured product prepared from a resin composition for a laminate and an enhancement in the resistance against chemicals be satisfied at the same time.

An object of the present invention is to provide a resin composition that has a variety of properties such as high flame retardancy required for a material for printed circuit boards, and can attain a cured product having high moldability, high resistance against chemicals in a desmearing step, and a small coefficient of thermal expansion, a prepreg comprising the resin composition, a laminate including the prepreg, a metallic foil clad laminate including the prepreg, and a printed circuit board including the prepreg.

Solution to Problem

The present inventors have found that a resin composition comprising an acrylic-silicone copolymer, a halogen-free epoxy resin, cyanic acid ester compound and/or a phenol resin, and an inorganic filler or comprising an acrylic-silicone copolymer, a BT resin, and an inorganic filler can solve the above problems, and have completed the present invention.

Namely, the present invention is as follows.

[1]
A resin composition, comprising:
an acrylic-silicone copolymer (A);
a halogen-free epoxy resin (B);
a cyanic acid ester compound (C), and/or a phenol resin (D); and
an inorganic filler (E).

[2]
The resin composition according to the above [1], wherein the acrylic-silicone copolymer (A) is fine particles, and
the fine particles of the acrylic-silicone copolymer (A) have an average primary particle size of 0.10 to 1.0 μm.

[3]
The resin composition according to the above [1] or [2], wherein the halogen-free epoxy resin (B) comprises one or more selected from the group consisting of phenol phenyl aralkyl novolac-based epoxy resins represented by the following formula (2), phenol biphenylaralkyl-based epoxy resins represented by the following formula (3), naphthol-aralkyl-based epoxy resins represented by the following formula (4), anthraquinone-based epoxy resins represented by the following formula (5), and polyoxynaphthylene-based epoxy resins represented by the following formula (6) or (7):

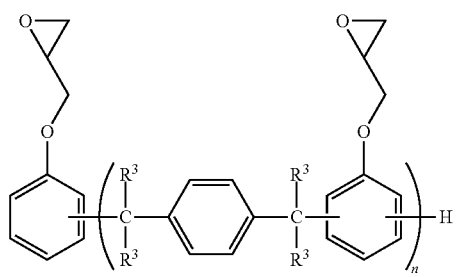
(2)

wherein $R^3$ each independently represents a hydrogen atom or a methyl group; and n represents an integer of 1 or more;

(3)

wherein $R^4$ each independently represents a hydrogen atom or a methyl group; and n represents an integer of 1 or more;

(4)

wherein $R^5$ each independently represents a hydrogen atom or a methyl group; and n represents an integer of 1 or more;

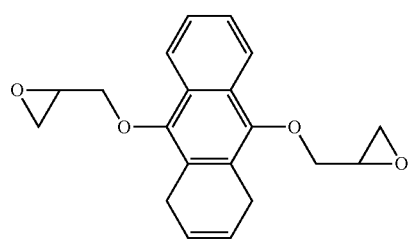
(5)

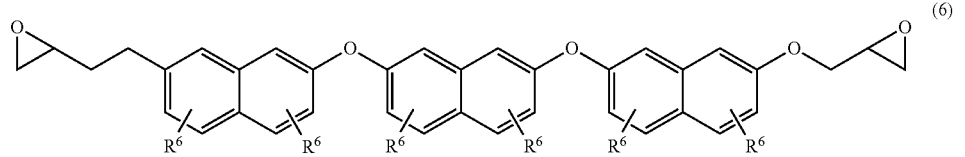
(6)

wherein $R^6$ each independently represents a hydrogen atom, an alkyl group having 1 to 4 carbon atoms, or an aralkyl group;

(7)

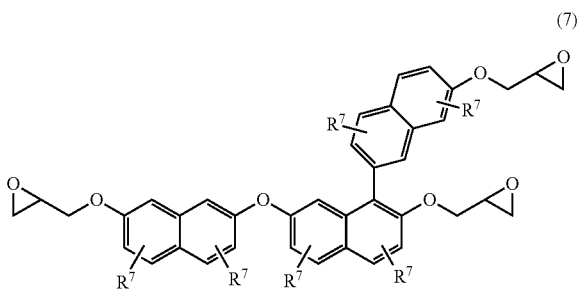

wherein $R^7$ each independently represents a hydrogen atom, an alkyl group having 1 to 4 carbon atoms, or an aralkyl group.

[4]
The resin composition according to any one of the above [1] to [3], wherein the cyanic acid ester compound (C) comprises one or more selected from the group consisting of naphtholaralkyl-based cyanic acid ester compounds represented by following formula (8), novolac-based cyanic acid ester compounds represented by the following formula (9), and biphenylaralkyl-based cyanic acid ester compounds represented by the following formula (10):

(8)

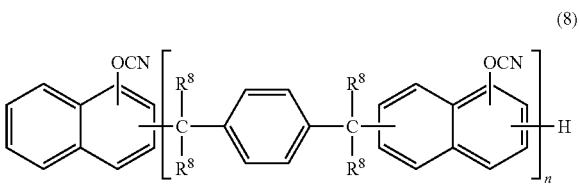

wherein $R^8$ each independently represents a hydrogen atom or a methyl group; and n represents an integer of 1 or more;

(9)

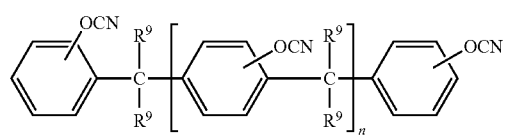

wherein $R^9$ each independently represents a hydrogen atom or a methyl group; and n represents an integer of 1 or more;

(10)

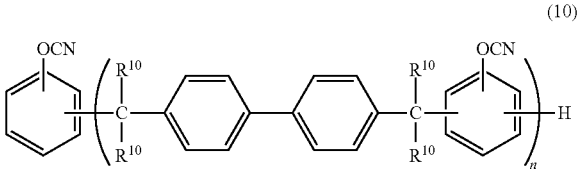

wherein $R^{10}$ each independently represents a hydrogen atom or a methyl group; and n represents an integer of 1 or more.

[5]
The resin composition according to any one of the above [1] to [4], wherein the phenol resin (D) comprises one or more selected from the group consisting of cresol novolac-based phenol resins, naphtholaralkyl-based phenol resins, biphenylaralkyl-based phenol resins, aminotriazine novolac-based phenol resins, and naphthalene-based phenol resins.

[6]
The resin composition according to any one of the above [1] to [5], further comprising a maleimide compound (F).

[7]
The resin composition according to the above [6], wherein the maleimide compound (F) comprises a compound represented by the following formula (13):

(13)

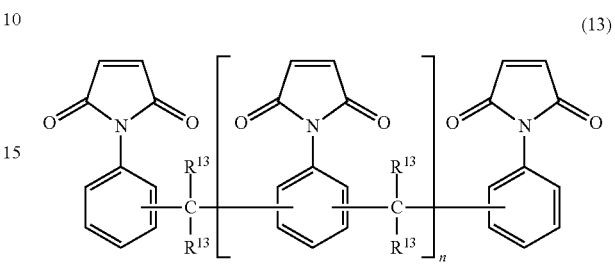

wherein $R^{13}$ each independently represents a hydrogen atom or a methyl group; and n represents an integer of 1 or more.

[8]
The resin composition according to any one of the above [1] to [7],
wherein the content of the acrylic-silicone copolymer (A) is:
3 to 50 parts by mass based on 100 parts by mass of a total of the halogen-free epoxy resin (B), the cyanic acid ester compound (C), and the phenol resin (D) when the maleimide compound (F) is not contained; and
3 to 50 parts by mass based on 100 parts by mass of a total of the halogen-free epoxy resin (B), the cyanic acid ester compound (C), the phenol resin (D), and the maleimide compound (F) when the maleimide compound (F) is contained.

[9]
The resin composition according to any one of the above [1] to [8],
wherein a content of the halogen-free epoxy resin (B) is:
5 to 60 parts by mass based on 100 parts by mass of the total of the halogen-free epoxy resin (B), the cyanic acid ester compound (C), and the phenol resin (D) when the maleimide compound (F) is not contained, and
5 to 60 parts by mass based on 100 parts by mass of the total of the halogen-free epoxy resin (B), the cyanic acid ester compound (C), the phenol resin (D), and the maleimide compound (F) when the maleimide compound (F) is contained.

[10]
The resin composition according to any one of the above [1] to [9],
wherein a total content of the cyanic acid ester compound (C) and the phenol resin (D) is:
10 to 50 parts by mass based on 100 parts by mass of the total of the halogen-free epoxy resin (B), the cyanic acid ester compound (C), and the phenol resin (D) when the maleimide compound (F) is not contained, and
10 to 50 parts by mass based on 100 parts by mass of the total of the halogen-free epoxy resin (B), the cyanic acid ester compound (C), the phenol resin (D), and the maleimide compound (F) when the maleimide compound (F) is contained.

[11]
The resin composition according to any one of the above [1] to [10], wherein the content of the inorganic filler (E) is:

50 to 500 parts by mass based on 100 parts by mass of the total of the halogen-free epoxy resin (B), the cyanic acid ester compound (C), and the phenol resin (D) when the maleimide compound (F) is not contained, and 50 to 500 parts by mass based on 100 parts by mass of the total of the halogen-free epoxy resin (B), the cyanic acid ester compound (C), the phenol resin (D), and the maleimide compound (F) when the maleimide compound (F) is contained.

[12]

The resin composition according to any one of the above [6] to [11], wherein a content of the maleimide compound (F) is 3 to 50 parts by mass based on 100 parts by mass of the total of the halogen-free epoxy resin (B), the cyanic acid ester compound (C), the phenol resin (D), and the maleimide compound (F).

[13]

A resin composition, comprising:
an acrylic-silicone copolymer (A);
a halogen-free epoxy resin (B);
a BT resin (G) prepared by forming a cyanic acid ester compound (C) and a maleimide compound (F) into a prepolymer; and
an inorganic filler (E).

[14]

The resin composition according to the above [13], wherein the cyanic acid ester compound (C) comprises one or more selected from the group consisting of naphthol-aralkyl-based cyanic acid ester compounds represented by the following formula (8), novolac-based cyanic acid ester compounds represented by the following formula (9), and biphenylaralkyl-based cyanic acid ester compounds represented by the following formula (10):

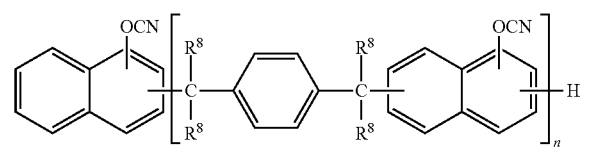

(8)

wherein $R^8$ each independently represents a hydrogen atom or a methyl group; and n represents an integer of 1 or more;

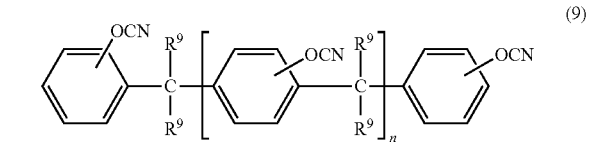

(9)

wherein $R^9$ each independently represents a hydrogen atom or a methyl group; and n represents an integer of 1 or more;

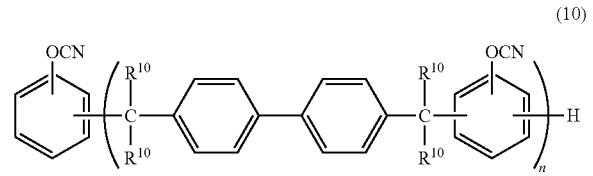

(10)

wherein $R^{10}$ each independently represents a hydrogen atom or a methyl group; and n represents an integer of 1 or more.

[15]

The resin composition according to the above [13] or [14], wherein the maleimide compound (F) comprises a compound represented by the following formula (13):

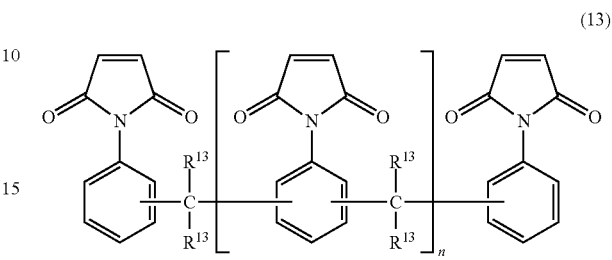

(13)

wherein $R^{13}$ each independently represents a hydrogen atom or a methyl group; and n represents an integer of 1 or more.

[16]

The resin composition according to any one of the above [13] to [15], wherein a content of the acrylic-silicone copolymer (A) is 3 to 50 parts by mass based on 100 parts by mass of a total of the halogen-free epoxy resin (B) and the BT resin (G).

[17]

The resin composition according to any one of the above [13] to [16], wherein a content of the halogen-free epoxy resin (B) is 5 to 60 parts by mass based on 100 parts by mass of the total of the halogen-free epoxy resin (B) and the BT resin (G).

[18]

The resin composition according to any one of the above [13] to [17], wherein a content of the BT resin (G) is 20 to 80 parts by mass based on 100 parts by mass of the total of the halogen-free epoxy resin (B) and the BT resin (G).

[19]

The resin composition according to any one of the above [13] to [18], wherein the content of the inorganic filler (E) is 50 to 400 parts by mass based on 100 parts by mass of the total of the halogen-free epoxy resin (B) and the BT resin (G).

[20]

The resin composition according to any one of the above [1] to [19], further comprising an imidazole compound (H) represented by the following formula (14):

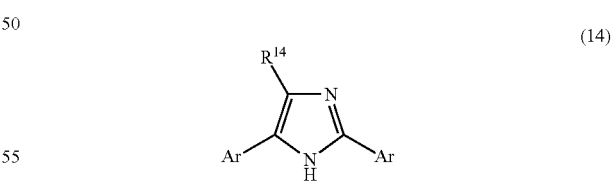

(14)

wherein Ar each independently represents a phenyl group, a naphthalene group, a biphenyl group, an anthracene group, or a hydroxyl-modified phenyl, naphthalene, biphenyl, or anthracene group; and $R^{14}$ represents a hydrogen atom, an alkyl group or hydroxyl-modified alkyl group, or an aryl group.

[21]

The resin composition according to the above [20], wherein the imidazole compound (H) comprises 2,4,5-triphenylimidazole.

[22]
The resin composition according to any one of the above [1] to [21], wherein the inorganic filler (E) comprises silica and/or boehmite.
[23]
A prepreg, comprising:
a base material, and the resin composition according to any one of the above [1] to [22] impregnated into or applied on the base material.
[24]
The prepreg according to the above [23], wherein the base material comprises one or more selected from the group consisting of E glass cloths, T glass cloths, S glass cloths, Q glass cloths, and organic fibers.
[25]
A laminate, comprising at least one of the prepregs according to the above [23] or [24].
[26]
A metallic foil clad laminate, comprising the prepreg according to the above [23] or [24], and a metallic foil disposed on one or both of the surfaces of the prepreg.
[27]
A printed circuit board, comprising an insulating layer, and a conductive layer disposed on a surface of the insulating layer,
wherein the insulating layer comprises the resin composition according to any one of the above [1] to [22].

Advantageous Effects of Invention

The present invention can provide a resin composition that has a variety of properties required for a material for printed circuit boards such as high flame retardancy, and can attain a cured product having high moldability, high resistance against chemicals in a desmearing step, and a small coefficient of thermal expansion, a prepreg comprising the resin composition, a laminate including the prepreg, a metallic foil clad laminate including the prepreg, and a printed circuit board including the prepreg.

DESCRIPTION OF EMBODIMENTS

Embodiments for carrying out the present invention (hereinafter referred to as "the present embodiment") will now be described in detail, but the present invention will not be limited to these, and can be modified in various ways without departing the gist.
[Resin Composition]
The resin composition according to one aspect of the present invention comprises an acrylic-silicone copolymer (A), a halogen-free epoxy resin (B), a cyanic acid ester compound (C) and/or a phenol resin (D), and an inorganic filler (E).
The resin composition according to another aspect of the present invention comprises an acrylic-silicone copolymer (A), a halogen-free epoxy resin (B), a BT resin (G) prepared by forming the cyanic acid ester compound (C) and the maleimide compound (F) into a prepolymer, and an inorganic filler (E).
Furthermore, another aspect of the present invention provides a prepreg comprising the resin composition and a base material, and a laminate, a metallic foil clad laminate and a printed circuit board comprising the prepreg.
The components forming the resin compositions according to the respective aspects will now be described.

[Acrylic-Silicone Copolymer (A)]
Examples of the acrylic-silicone copolymer (A) used in the present embodiment include, but should not be limited to, copolymers including a (meth)acrylic acid ester monomer (a) unit and a radical polymerizable silicone macromonomer (b) unit. Through the specification, a "monomer unit" indicates a repeating unit of a polymer derived from a predetermined monomer.
The (meth)acrylic acid ester monomer (a) can be any (meth)acrylic acid ester monomer, and is preferably esters of alcohols or phenols having 1 to 18 carbon atoms and acrylic acid or methacrylic acid. Examples of such (meth)acrylic acid esters include alkyl (meth)acrylates such as methyl (meth)acrylate, ethyl (meth)acrylate, butyl (meth)acrylate, 2-ethylhexyl (meth)acrylate, isobutyl (meth)acrylate, hexyl (meth)acrylate, octyl (meth)acrylate, lauryl (meth)acrylate, and stearyl (meth)acrylate; alkoxyalkyl (meth)acrylates such as methoxyethyl (meth)acrylate and butoxyethyl (meth) acrylate; cyclohexyl (meth)acrylate; phenyl (meth)acrylate; and benzyl (meth)acrylate. These (meth)acrylic acid ester monomers (a) can be used singly or in combination of two or more thereof.
Optionally a monomer copolymerizable with the (meth) acrylic acid ester monomer (a) can be additionally used to ensure dispersibility and miscibility in a combination with other resin components in the present embodiment. Examples of the monomer copolymerizable with the (meth) acrylic acid ester monomer (a) include, but should not be limited to, styrene, α-methylstyrene, vinyltoluene, acrylonitrile, vinyl chloride, vinylidene chloride, vinyl acetate, vinyl propionate, and vinyl versatate. These monomers copolymerizable with the (meth)acrylic acid ester monomer (a) can be used singly or in combination of two or more thereof.
Examples of the radical polymerizable silicone macromonomer (b) include, but should not be limited to, compounds represented by the following formula (1). Examples of the radical polymerizable silicone macromonomer (b) represented by the following formula (1) include, but should not be limited to, compounds which can be prepared by the method described in Japanese Patent Application Laid-Open No. 59-78236 or 6-228316. These radical polymerizable silicone macromonomers (b) can be used singly or in combination of two or more thereof.

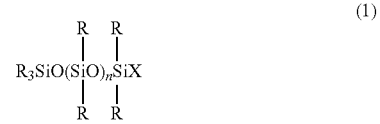

wherein R each independently represents an unsubstituted or substituted monovalent hydrocarbon group having 1 to 12 carbon atoms; the proportion of a R that is a methyl group is 50 mol % or more with respect to all of the Rs; X represents a radical polymerizable functional group-containing organic group; n represents an integer of 5 or more and 200 or less.
In the formula (1), R can be any unsubstituted or substituted monovalent hydrocarbon group having 1 to 12 carbon atoms. Examples thereof include alkyl groups such as a methyl group, an ethyl group, and a propyl group; aryl groups such as a phenyl group, a tolyl group, and a naphthyl group; aralkyl groups such as an α-phenethyl group and a benzyl group; and an alkyl group, an aryl group, and an aralkyl group in which a hydrogen atom bonded to a carbon atom is substituted by a halogen atom. Among these, a methyl group, a butyl group, and a phenyl group are preferable from the industrial viewpoint. From the viewpoint of giving properties such as slipping properties and anti-blocking properties, the proportion of the R that is a methyl group with respect to all of the Rs is 50 mol % or more, and is preferably 70 mol % or more. The upper limit of the proportion of the R that is a methyl group with respect to all of the Rs is not limited, and is preferably 100 mol %.

In the formula (1), X can be any radical polymerizable functional group-containing organic group. Examples thereof include groups represented by the following formulae (1a) and (1b):

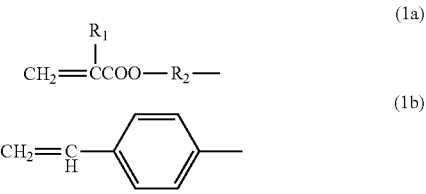

wherein $R^1$ represents a hydrogen atom or a methyl group, and $R^2$ represents a divalent organic group that has 3 to 20 carbon atoms and can have a heteroatom.

In the formula (1a), $R^2$ can be any divalent organic group that has 3 to 20 carbon atoms and can have a heteroatom. Examples thereof include —$(CH_2)_3$—, —$(CH_2)_2O(CH_2)_3$—, —$(CH_2)_2S(CH_2)_3$—, —$(CH_2)_4$—, —$(CH_2CH_2O)_2(CH_2)_3$—, —$CH_2CH(CH_3)O(CH_2)_3$—, and —$[CH_2CH(CH_3)O]_2(CH_2)_3$—.

In the formula (1a), n represents an integer of 5 or more and 200 or less, more preferably 10 or more and 180 or less.

The content of the (meth)acrylic acid ester monomer (a) unit in the acrylic-silicone copolymer (A) is preferably 30 to 95% by mass, more preferably 40 to 93% by mass based on the total content (100% by mass) of the (meth)acrylic acid ester monomer (a) unit and the radical polymerizable silicone macromonomer (b) unit. When the content of the (meth)acrylic acid ester monomer (a) unit is within this range, productivity will increase more significantly.

The content of the radical polymerizable silicone macromonomer (b) unit in the acrylic-silicone copolymer (A) is preferably 5 to 70% by mass, more preferably 7 to 60% by mass based on the total content (100% by mass) of the (meth)acrylic acid ester monomer (a) unit and the radical polymerizable silicone macromonomer (b) unit. When the content of the radical polymerizable silicone macromonomer (b) unit is within this range, productivity will increase more significantly.

As a method for copolymerizing the (meth)acrylic acid ester monomer (a) and the radical polymerizable silicone macromonomer (b) to prepare the acrylic-silicone copolymer (A), any known polymerization method such as emulsion polymerization, suspension polymerization, solution polymerization, and bulk polymerization can be used. Among these, emulsion polymerization is preferable in consideration of dangerousness, environmental friendliness, and readiness in control of the fine particle size.

Any standard radical polymerization initiator can be used without limitation as a polymerization initiator for copolymerization. Specific examples thereof include oil-soluble radical polymerization initiators such as benzoyl peroxide, dicumyl peroxide, lauroyl peroxide, 2,2'-azobis-(2-methylbutyronitrile), 2,2'-azobisisobutyronitrile, and t-butylperoxy-2-ethylhexanoate; and water-soluble radical polymerization initiators such as potassium persulfate, ammonium persulfate, hydrogen peroxide solution, t-butyl hydroperoxide, t-butyl peroxypivalate, and 2,2'-azobis-(2-N-benzylamidino) propane hydrochloride. Furthermore, a redox polymerization initiator in combination with a reducing agent such as acidic sodium sulfite, rongalite, and L-ascorbic acid can be optionally used.

Examples of surfactants used in emulsion polymerization include, but should not be limited to, alkyl benzenesulfonates such as sodium dodecylbenzenesulfonate; anionic surfactants such as alkyl naphthalenesulfonate, alkyl sulfosuccinate, sodium polyoxyethylene alkyl phenyl ether sulfate, and sodium laurylsulfate; nonionic surfactants such as polyoxyethylene alkylether, polyoxyethylene alkylphenyl ether, sorbitan fatty acid ester, and ethylene oxide-propylene oxide block copolymer; and cationic surfactants such as quaternary ammonium salts such as alkyltrimethylammonium chloride and alkylbenzylammonium chloride, and alkylamine salts.

Examples of the surfactants used in emulsion polymerization include, but should not be limited to, reactive anionic surfactants described in Japanese Patent Application Laid-Open Nos. 54-144317, 55-115419, 62-34947, 58-203960, 4-53802, 62-104802, 49-40388, and 52-134658, and Japanese Patent Publication No. 49-46291; reactive nonionic surfactants described in Japanese Patent Application Laid-Open Nos. 53-126093, 56-28208, 4-50204, 62-104802, and 50-98484; and reactive cationic surfactants having quaternary ammonium salts or tertiary amine salts and radical polymerizable groups.

Examples of a suspending agent used in suspension polymerization include, but should not be limited to, polyvinyl alcohol, carboxymethyl cellulose, polyalkylene oxide, polyacrylic acid, and polyacrylates.

Any polymerization temperature can be used, and the polymerization temperature is preferably 10 to 150° C., more preferably 30 to 90° C. A polymerization temperature within this range can complete the polymerization reaction or about 3 to 10 hours.

In the emulsion polymerization, the emulsion of the acrylic-silicone copolymer (A) after polymerization is subjected to flocculation, washing with water, dehydration, and drying or direct drying with a spray dryer to obtain a spherical, fine particulate acrylic-silicone copolymer (A).

In the suspension polymerization, the emulsion of the acrylic-silicone copolymer (A) after polymerization is subjected to dehydration, washing with water, and drying to obtain a spherical, fine particulate acrylic-silicone copolymer (A).

In the solution polymerization, the acrylic-silicone copolymer (A) is precipitated in a poor solvent, and the precipitated acrylic-silicone copolymer (A) is filtered and dried, or the precipitated acrylic-silicone copolymer (A) including the poor solvent is directly dried with a spray dryer to obtain a spherical, fine particulate acrylic-silicone copolymer (A).

Alternatively, the (meth)acrylic acid ester monomer (a) may be polymerized by emulsion polymerization or suspension polymerization; or the (meth)acrylic acid ester monomer (a) and the radical polymerizable silicone macromonomer (b) may be copolymerized to prepare core fine particles preliminarily, and an emulsified product of the radical polymerizable silicone macromonomer (b) may be reacted with the surfaces of the core fine particles to prepare fine particles of the acrylic-silicone copolymer (A) having a higher distribution density of a dimethylpolysiloxanyl group in the surface layer. In this method, fine particles of the acrylic-silicone copolymer (A) can be prepared by drying a solution containing the fine particles of the acrylic-silicone copolymer (A).

To attain a cured product having a smaller coefficient of thermal expansion, and higher resistance against chemicals, the acrylic-silicone copolymer (A) is preferably in a form of fine particles. The fine particles of the acrylic-silicone copolymer (A) can have any shape, and preferably has a spherical shape in consideration of the dispersibility in other resins used in the present embodiment.

The fine particles of the acrylic-silicone copolymer (A) can have any average particle size (D50). To attain a cured product having a smaller coefficient of thermal expansion, and higher resistance against chemicals, the average particle size is preferably 20 to 400 μm, more preferably 20 to 40 μm, still more preferably 25 to 35 μm. The term "D50", as used herein, indicates a Median Diameter, and is meant or a diameter at which the particle size distribution of the powder including monocrystalline primary particles and aggregates thereof, i.e., secondary or higher order particles, can be divided into two parts, such that the totals of the number or the mass of particles belonging to each of the larger and smaller diameter part constitute 50% of the number or the mass of the entire powder. The average particle size (D50) can be typically measured by a wet laser diffraction scattering method.

To attain a cured product having higher moldability, higher resistance against chemicals, and a smaller coefficient of thermal expansion, the average primary particle size of the acrylic-silicone copolymer (A) is preferably 0.10 to 1.0 μm, more preferably 0.20 to 0.50 μm, still more preferably 0.20 to 0.30 μm. The acrylic-silicone copolymer (A) can have any average primary particle size. The average primary particle size can be measured by a method using an electronic microscope, for example. The particles of the acrylic-silicone copolymer (A) can include smaller particles (primary particles) and particles having a large apparent particle size (secondary or higher particles), which are aggregates of primary particles.

Commercially available products can also be used as the acrylic-silicone copolymer (A) used in the present embodiment. Examples of commercially available products include Chaline R-170, R-170S, and R-1700S (available from Nissin Chemical Industry Co., Ltd.).

The acrylic-silicone copolymer (A) can be contained in any content in the resin composition according to one aspect of the present invention. When the maleimide compound (F) is not contained, the content is preferably 3 to 50 parts by mass, more preferably 5 to 40 parts by mass based on 100 parts by mass of the total of the halogen-free epoxy resin (B), the cyanic acid ester compound (C), and the phenol resin (D). When the maleimide compound (F) is contained, the content is preferably 3 to 50 parts by mass, more preferably 5 to 40 parts by mass based on 100 parts by mass of the total of the halogen-free epoxy resin (B), the cyanic acid ester compound (C), the phenol resin (D), and the maleimide compound (F), which is contained as an optional component.

The acrylic-silicone copolymer (A) can be contained in any content in the resin composition according to another aspect of the present invention. The content is preferably 3 to 50 parts by mass, more preferably 5 to 40 parts by mass based on 100 parts by mass of the total of the halogen-free epoxy resin (B) and the BT resin (G).

At a content of the acrylic-silicone copolymer (A) of 3 parts by mass or more, the resulting cured product will have a significantly reduced elastic modulus and thermal expansion. At a content of the acrylic-silicone copolymer (A) of 50 parts by mass or less, the resulting cured product will have higher resistance against chemicals during the desmearing step and the resin composition will have higher molderbility.

[Halogen-Free Epoxy Resin (B)]

In the resin composition according to the present embodiment, the halogen-free epoxy resin (B) can be any halogen-free epoxy resin having no halogen atom in the molecular structure. Specific examples thereof include phenol phenyl aralkyl novolac-based epoxy resins represented by the following formula (2), phenol biphenylaralkyl-based epoxy resins represented by the following formula (3), naphtholaralkyl-based epoxy resins represented by the following formula (4), anthraquinone-based epoxy resins represented by the following formula (5), and polyoxynaphthylene-based epoxy resins represented by the following formulae (6) and (7), bisphenol A-based epoxy resins, bisphenol F-based epoxy resins, phenol novolac-based epoxy resins, cresol novolac-based epoxy resins, bisphenol A novolac-based epoxy resins, trifunctional phenol-based epoxy resins, tetrafunctional phenol-based epoxy resins, naphthalene-based epoxy resins, biphenyl-based epoxy resins, aralkyl novolac-based epoxy resins, alicyclic epoxy resins, polyol-based epoxy resins, glycidylamine, glycidyl ester, compounds prepared by epoxidizing a double bond of butadiene, and compounds prepared by a reaction of hydroxyl group-containing silicone resins with epichlorohydrin. Among these, one or more resins selected from the group consisting of the phenol phenyl aralkyl novolac-based epoxy resins represented by the following formula (2), the phenol biphenylaralkyl-based epoxy resins represented by the following formula (3), the naphtholaralkyl-based epoxy resins represented by the following formula (4), anthraquinone-based epoxy resins represented by the following formula (5), and the polyoxynaphthylene-based epoxy resins represented by the following formulae (6) and (7) are preferable in consideration of an enhancement of the properties, specifically the flame retardancy, of the resulting cured product. The anthraquinone-based epoxy resins represented by the following formula (5) are preferable or a further reduction in the coefficient of thermal expansion of the resulting cured product.

These halogen-free epoxy resins (B) can be used singly or in combination of two or more thereof.

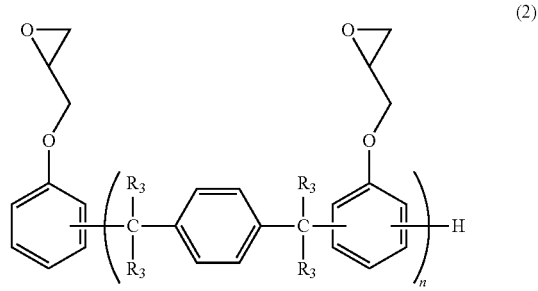

(2)

In the formula (2), $R^3$ each independently represents a hydrogen atom or a methyl group. Among these, a hydrogen atom is preferable. In the formula (2), n represents an integer of 1 or more. The upper limit value of n is generally 10, preferably 7.

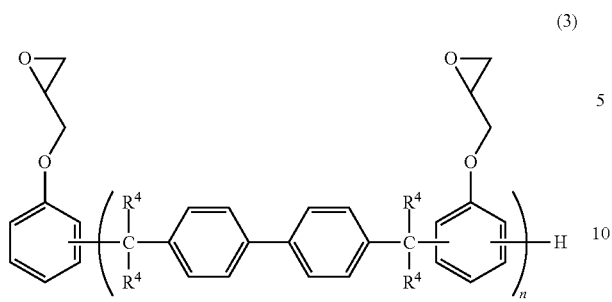

(3)

In the formula (3), $R^4$ each independently represents a hydrogen atom or a methyl group. Among these, a hydrogen atom is preferable. In the formula (3), n represents an integer of 1 or more. The upper limit value of n is generally 10, preferably 7.

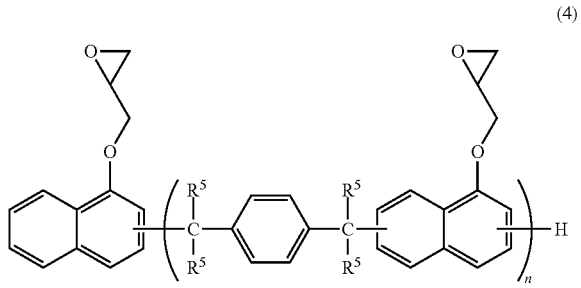

(4)

In the formula (4), $R^5$ represents a hydrogen atom or a methyl group. Among these, a hydrogen atom is preferable. In the formula (4), n represents an integer of 1 or more. The upper limit value of n is generally 10, preferably 7.

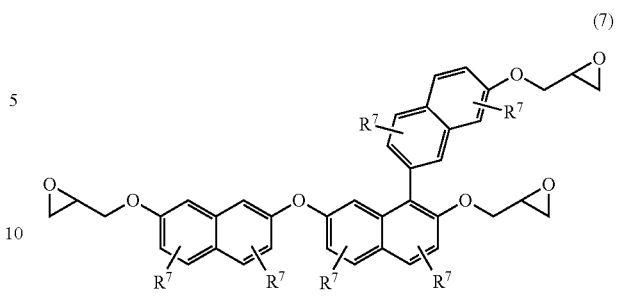

(7)

In the formula (7), $R^7$ each independently represents a hydrogen atom, an alkyl group having 1 to 4 carbon atoms, or an aralkyl group.

Commercially available products can be used as the polyoxynaphthylene-based epoxy resins represented by the formulae (6) and (7). Examples of the commercially available products include, but should not be limited to, EXA-7311, EXA-7311-G3, EXA-7311-G4, EXA-7311-G4S, EXA-7311L, and HP-6000 available from DIC Corporation.

A phosphorus-containing epoxy resin or a brominated epoxy resin can be used in combination according to the applications required. The phosphorus-containing epoxy resin can be any phosphorus atom-containing compound having two or more epoxy groups in the molecule. Specific examples thereof include methyldiglycidyl phosphonate, ethyldiglycidyl phosphonate, propyldiglycidyl phosphonate, butyldiglycidyl phosphonate, vinyldiglycidyl phosphonate, phenyldiglycidyl phosphonate, biphenyldiglycidyl phosphonate, methyldiglycidyl phosphate, ethyldiglycidyl phosphate, n-propyldiglycidyl phosphate, n-butyldiglycidyl phosphate, isobutyldiglycidyl phosphate, allyldiglycidyl phosphate, phenyldiglycidyl phosphate, p-methoxyphenyldiglycidyl phosphate, p-ethoxyphenyldiglycidyl phosphate,

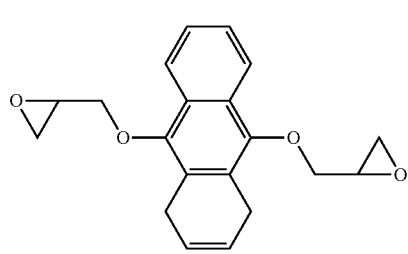

(5)

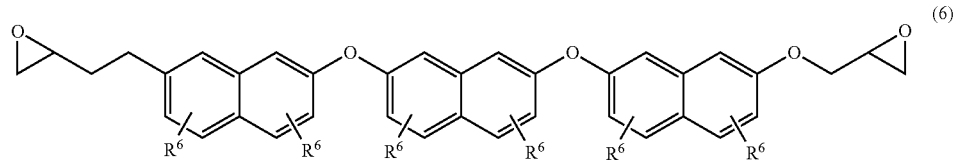

(6)

In the formula (6), $R^6$ each independently represents a hydrogen atom, an alkyl group having 1 to 4 carbon atoms, or an aralkyl group.

p-propyloxyphenyldiglycidyl phosphate, p-isopropyloxyphenyldiglycidyl phosphate, phenylthiodiglycidyl phosphate, triglycidyl phosphate, tris(glycidylethyl) phosphate, p-glycidyl-phenylethyl-glycidyl phosphate, and benzyl-diglycidyl thiophosphate. The brominated epoxy resin can be any bromine atom-containing compound having two or more epoxy groups in the molecule. Specific examples thereof include brominated bisphenol A-based epoxy resins and brominated phenol novolac-based epoxy resins.

The halogen-free epoxy resin (B) can be contained in any content in the resin composition according to one aspect of the present invention. When the maleimide compound (F) is not contained, the content is preferably 5 to 60 parts by mass, more preferably 10 to 40 parts by mass based on 100 parts by mass of the total of the halogen-free epoxy resin (B), the cyanic acid ester compound (C), and the phenol resin (D). When the maleimide compound (F) is contained, the content is preferably 5 to 60 parts by mass, more preferably 10 to 40 parts by mass based on 100 parts by mass of the total of the halogen-free epoxy resin (B), the cyanic acid ester compound (C), the phenol resin (D), and the maleimide compound (F), which is contained as an optional component.

The halogen-free epoxy resin (B) can be contained in any content in the resin composition according to another aspect of the present invention. The content is preferably 5 to 60 parts by mass, more preferably 10 to 40 parts by mass based on 100 parts by mass of the total of the halogen-free epoxy resin (B) and the BT resin (G).

At a content of the halogen-free epoxy resin (B) within this range, the resin composition has higher curing properties and the resulting cured product has higher flame retardancy, an improved glass transition temperature, reduced water absorption, and a reduced elastic modulus.

[Cyanic Acid Ester Compound (C)]

A cyanic acid ester compound (C) enhances the resistance against chemicals and the adhesiveness of the resulting cured product more significantly. Examples of the cyanic acid ester compound (C) include, but should not be limited to, naphtholaralkyl-based cyanic acid esters compounds represented by Formula (8), novolac-based cyanic acid esters compounds represented by Formula (9), biphenylaralkyl-based cyanic acid ester compounds represented by Formula (10), bis(3,5-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone, and 2,2-bis(4-cyanatophenyl)propane.

Among these, the naphtholaralkyl-based cyanic acid ester compounds represented by the following formula (8), the novolac-based cyanic acid ester compounds represented by the following formula (9), and the biphenylaralkyl-based cyanic acid ester compounds represented by the following formula (10) are preferable to more significantly enhance the curing properties of the resin composition and the flame retardancy of the cured product thereof and more significantly reduce the coefficient of thermal expansion of the cured product thereof. These cyanic acid ester compounds (C) can be used singly or in combination of two or more thereof.

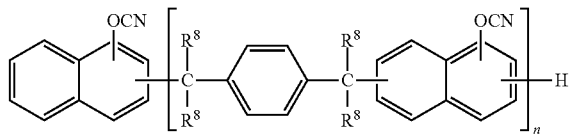

wherein $R^8$ each independently represents a hydrogen atom or a methyl group; among these, a hydrogen atom is preferable; n represents an integer of 1 or more; n is generally 10 at most, and is preferably 7, more preferably 6.

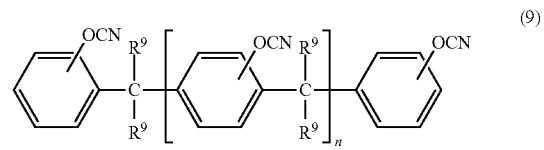

wherein $R^9$ each independently represents a hydrogen atom or a methyl group; among these, a hydrogen atom is preferable; n represents an integer of 1 or more; n is generally 10 at most, and is preferably 7.

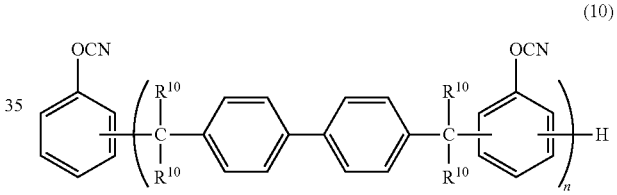

In the formula (10), $R^{10}$ each independently represents a hydrogen atom or a methyl group. Among these, a hydrogen atom is preferable. In the formula (10), n represents an integer of 1 or more. n is generally 10 at most, and is preferably 7.

These cyanic acid ester compounds (C) can be prepared by any known method used in synthesis of cyanic acid esters. In the method of preparing the naphtholaralkyl-based cyanic acid ester compound represented by the formula (8), the cyanic acid ester compound (C) can be prepared specifically by reacting a naphtholaralkyl-based phenol resin represented by the following formula (11) with a cyanogen halide in an inactive organic solvent in the presence of a basic compound. The cyanic acid ester compound (C) can be also prepared by forming a salt of a naphtholaralkyl-based phenol resin represented by the following formula (11) and a basic compound in an aqueous solution, and reacting the formed salt with a cyanogen halide by a two-phase interfacial reaction. Another cyanic acid ester compound (C) can be prepared in the same way by the reaction of a cyanogen halide with a compound, which is the same as the aimed cyanic acid ester except that it has a hydroxyl group instead of the cyano group.

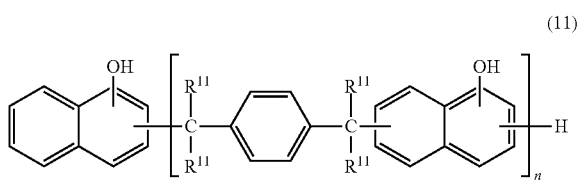

(11)

In the formula (11), $R^{11}$ each independently represents a hydrogen atom or a methyl group. Among these, a hydrogen atom is preferable. In the formula (11), n represents an integer of 1 or more. n is generally 10 at most, and is preferably 7, more preferably 6.

The naphtholaralkyl-based cyanic acid ester compound can be selected from the group consisting of compounds prepared by condensation of cyanic acid and naphtholaralkyl resins prepared by a reaction of naphthols such as α-naphthol or β-naphthol with p-xylylene glycol, α,α'-dimethoxy-p-xylene, and 1,4-di(2-hydroxy-2-propyl)benzene.

The ratio (CN/Ep) of the number of cyanate groups of the cyanic acid ester compound (C) to the number of epoxy groups of the epoxy resin in the resin composition can be any numeric value. The ratio is preferably 0.7 to 2.5, more preferably 0.7 to 1.5 from the viewpoint of the heat resistance, the flame retardancy, and the water absorption of the resulting cured product.

[Phenol Resin (D)]

The phenol resin (D) used in the present embodiment can be any known phenol resin having two or more phenolic hydroxyl groups in the molecule, and can be of any type. Specific examples thereof include cresol novolac-based phenol resins, naphtholaralkyl-based phenol resins represented by the following formula (11), biphenylaralkyl-based phenol resins represented by the following formula (12), aminotriazine novolac-based phenol resins, naphthalene-based phenol resins, phenol novolac resins, alkylphenol novolac resins, bisphenol A-based novolac resins, dicyclopentadiene-based phenol resins, xylock-based phenol resin, terpene modified phenol resins, and polyvinyl phenols. Among these, cresol novolac-based phenol resins, the naphtholaralkyl-based phenol resins represented by the following formula (11), the biphenylaralkyl-based phenol resins represented by the following formula (12), aminotriazine novolac-based phenol resins, and naphthalene-based phenol resins are preferable, and cresol novolac-based phenol resins, the naphtholaralkyl-based phenol resins represented by the following formula (11), and biphenylaralkyl-based phenol resins represented by the following formula (12) are more preferable from the viewpoint of the moisture absorbing properties and the heat resistance of the resulting cured product. These phenol resin (D) can be used singly or in combination of two or more thereof according to the purpose.

When the resin composition contains the phenol resin (D), the ratio (OH/Ep) of the number of phenol groups of the phenol resin (D) to the number of epoxy groups of the epoxy resin is preferably 0.7 to 2.5, more preferably 0.7 to 1.5. At a ratio (OH/Ep) of 0.7 or more, the resulting cured product will have an improved glass transition temperature. At a ratio (OH/Ep) of 2.5 or less, the resulting cured product will have higher flame retardancy.

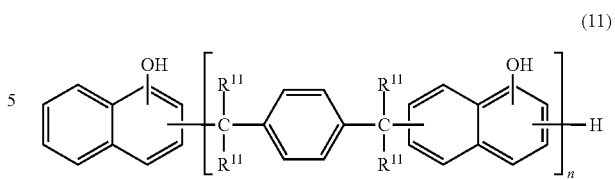

(11)

wherein $R^{11}$ each independently represents a hydrogen atom or a methyl group; among these, a hydrogen atom is preferable; n represents an integer of 1 or more; n is generally 10 at most, and is preferably 7, more preferably 6.

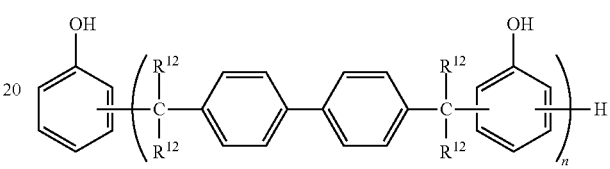

(12)

wherein $R^{12}$ each independently represents a hydrogen atom or a methyl group; among these, a hydrogen atom is preferable; n represents an integer of 1 or more; n is generally 10 at most, and is preferably 7.

In the resin composition according to the present embodiment, the total content of the cyanic acid ester compound (C) and the phenol resin (D) is determined because both of them act as curing agents in the resin composition.

When the maleimide compound (F) is not contained, the total content of the cyanic acid ester compound (C) and the phenol resin (D) in the resin composition according to one aspect of the present invention is preferably 10 to 50 parts by mass, more preferably 20 to 40 parts by mass based on 100 parts by mass of the total of the halogen-free epoxy resin (B), the cyanic acid ester compound (C), and the phenol resin (D). When the maleimide compound (F) is contained, the content is preferably 10 to 50 parts by mass, more preferably 20 to 40 parts by mass based on 100 parts by mass of the total of the halogen-free epoxy resin (B), the cyanic acid ester compound (C), the phenol resin (D), and the maleimide compound (F), which is contained as an optional component.

The resin composition according to another aspect of the present invention may further contain the cyanic acid ester compound (C) and/or the phenol resin (D). In this case, the total content of the cyanic acid ester compound (C) and the phenol resin (D) is preferably 5 to 50 parts by mass, more preferably 10 to 40 parts by mass based on 100 parts by mass of the total of the halogen-free epoxy resin (B) and the BT resin (G).

If the total content of the cyanic acid ester compound (C) and the phenol resin (D) is within this range, the resin composition will attain higher curing properties, and attain the resulting cured product having higher flame retardancy, an improved glass transition temperature, lower water absorption, and lower elastic modulus.

[Inorganic Filler (E)]

The inorganic filler (E) used in the present embodiment can be any inorganic filler typically used in the art. Specific examples thereof include silicas such as natural silica, fused silica, amorphous silica, and hollow silica; metal hydrates such as aluminum hydroxide, heated products of aluminum hydroxide (aluminum hydroxide heated to remove part of crystalline water), boehmite, and magnesium hydroxide; molybdenum compounds such as molybdenum oxide and molybdic acid zinc; and zinc borate, zinc stannate, alumina, clay, kaolin, talc, calcined clay, calcined kaolin, calcined talc, mica, glass short fibers (glass fine particles such as E glass and D glass), hollow glass, and spherical glass. Among these, silicas, boehmite, magnesium hydroxide, alumina, and talc are preferable, and silicas and boehmite are more preferable because the resulting cured product has a smaller coefficient of thermal expansion and higher resistance to flame. Molybdenum compounds and molybdic acid compounds coated with inorganic oxides are preferable from the viewpoint of higher drilling processability. These inorganic fillers (E) can be used singly or in combination of two or more thereof.

The inorganic filler (E) can have any average particle size (D50). The average particle size is preferably 0.2 to 5 µm, more preferably 0.2 to 3 µm from the viewpoint of dispersibility.

The inorganic filler (E) can be contained in any content in the resin composition according to one aspect of the present invention. When the maleimide compound (F) is not contained, the content is preferably 50 to 500 parts by mass, more preferably 80 to 300 parts by mass based on 100 parts by mass of the total of the halogen-free epoxy resin (B), the cyanic acid ester compound (C), and the phenol resin (D). When the maleimide compound (F) is contained, the content is preferably 50 to 500 parts by mass, more preferably 80 to 300 parts by mass based on 100 parts by mass of the total of the halogen-free epoxy resin (B), the cyanic acid ester compound (C), the phenol resin (D), and the maleimide compound (F), which is contained as an optional component.

The inorganic filler (E) can be contained in any content in the resin composition according to another aspect of the present invention. The content is preferably 50 to 500 parts by mass, more preferably 80 to 300 parts by mass based on 100 parts by mass of the total of the halogen-free epoxy resin (B) and the BT resin (G).

If the content of the inorganic filler (E) is within this range, the resulting cured product will attain higher flame retardancy, higher moldability, and higher drilling processability.

To enhance the dispersibility of the inorganic filler (E) and the adhesion strength between the resin and the inorganic filler (E) or a glass cloth, the inorganic filler (E) can be used in combination with a silane coupling agent and/or a wet dispersant.

The silane coupling agent can be any silane coupling agent typically used in the surface treatment of inorganic substances. Specific examples thereof include aminosilane-based compounds such as γ-aminopropyltriethoxysilane and N-β-(aminoethyl)-γ-aminopropyltrimethoxysilane; epoxysilane-based compounds such as γ-glycidoxypropyltrimethoxysilane; vinylsilane-based compounds such as γ-methacryloxypropyltrimethoxysilane; cationic silane-based compounds such as N-β-(N-vinylbenzylaminoethyl)-γ-aminopropyltrimethoxysilane hydrochloride; and phenylsilane-based compounds. These silane coupling agents can be used alone or in combination.

The wet dispersant can be any dispersion stabilizer typically used in coating materials. Specific examples thereof include Disperbyk-110, 111, 180, and 161 and BYK-W996, W9010, and W903 available from BYK Japan K.K. These wet dispersants can be used singly or in combination of two or more thereof.

[Maleimide Compound (F)]

The resin composition may contain the maleimide compound (F). The maleimide compound (F) that can be used in the resin composition according to the present embodiment can be any compound having one or more maleimide groups in one molecule. Specific examples thereof include N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, the maleimide compounds represented by the following formula (13), prepolymers of these maleimide compounds, and prepolymers of the above-described maleimide compounds and amine compounds. Among these, bis(4-maleimidephenyl)methane, 2,2-bis{4-(4-maleimidephenoxy)-phenyl}propane, bis(3-ethyl-5-methyl-4-maleimidephenyl)methane, and maleimide compounds represented by the following formula (13) are preferable, and maleimide compounds represented by the following formula (13) are more preferable. These maleimide compounds (F) can be used singly or in combination of two or more thereof.

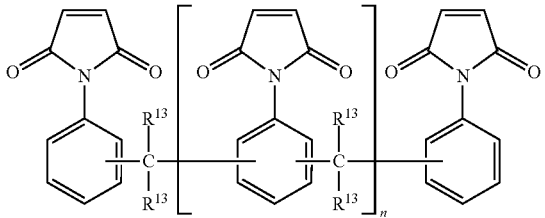

(13)

In the formula (13), $R^{13}$ each independently represents a hydrogen atom or methyl group. Among these, a hydrogen atom is preferable. In the formula (13), n represents an integer of 1 or more. n is generally 10 at most, and is preferably 7.

The maleimide compound (F) can be contained in any content in the resin composition according to one aspect of the present invention. The content is preferably 3 to 50 parts by mass, more preferably 10 to 40 parts by mass based on 100 parts by mass of the total of the halogen-free epoxy resin (B), the cyanic acid ester compound (C), the phenol resin (D), and the maleimide compound (F), which is contained as an optional component.

The resin composition according to another aspect of the present invention may further contain the maleimide compound (F). In this case, the maleimide compound (F) can be contained in any content, which is preferably 3 to 50 parts by mass, more preferably 10 to 40 parts by mass based on 100 parts by mass of the total of the halogen-free epoxy resin (B) and the BT resin (G).

If the content of the maleimide compound (F) is within this range, the resin composition will attain higher curing properties, and attain the resulting cured product having higher flame retardancy, an improved glass transition temperature, lower water absorption, and lower elastic modulus.

[BT Resin (G)]

The BT resin (G) used in the present embodiment is a prepolymer formed of the cyanic acid ester compound (C) and the maleimide compound (F). The prepolymer can be prepared by any method. Examples thereof include a method of mixing the cyanic acid ester compound (C) and the maleimide compound (F) under heating without dissolving in a solvent, or after dissolving these compounds in an organic solvent such as methyl ethyl ketone, N-methylpyrrolidone, dimethylformamide, dimethylacetamide, toluene, and xylene.

As the cyanic acid ester compound (C), the same compounds listed above can be used without limitation. Among these, the naphtholaralkyl-based cyanic acid ester compounds represented by formula (8), the novolac-based cyanic acid ester compounds represented by formula (9), and the biphenylaralkyl-based cyanic acid ester compounds represented by formula (10) are preferable because the resin composition attains higher curing properties, and attains the resulting cured product having higher flame retardancy and a smaller coefficient of thermal expansion. These cyanic acid ester compounds (C) can be used singly or in combination of two or more thereof.

As the maleimide compound (F), the same compounds listed above can be used without limitation. Among these, bis(4-maleimidephenyl)methane, 2,2-bis{4-(4-maleimidephenoxy)-phenyl}propane, bis(3-ethyl-5-methyl-4-maleimidephenyl)methane, and maleimide compounds represented by the formula (13) are preferable, and maleimide compounds represented by the formula (13) are more preferable from the viewpoint of heat resistance. These maleimide compounds (F) can be used singly or in combination of two or more.

The BT resin (G) can contain the maleimide compound (F) in any proportion. The proportion is preferably 5 to 75% by mass, more preferably 10 to 70% by mass based on the total amount of the BT resin (G) from the viewpoint of the glass transition temperature, the flame retardancy, and the curing properties.

The prepolymer or the BT resin (G) can have any number average molecular weight. The number average molecular weight is preferably 100 to 100,000, more preferably 100 to 80,000 from the viewpoint of the handling properties, the glass transition temperature, and the curing properties.

The resin composition according to another aspect of the present invention can contain the BT resin (G) in any content. The content is preferably 20 to 80 parts by mass, more preferably 30 to 70 parts by mass based on 100 parts by mass of the total of the halogen-free epoxy resin (B) and the BT resin (G). If the content of the BT resin (G) is within this range, the resin composition will attain higher curing properties, and attain the resulting cured product having higher flame retardancy, an improved glass transition temperature, lower water absorption, and lower elastic modulus.

[Imidazole Compound (H)]

The resin composition according to the present embodiment may contain an imidazole compound (H) represented by the following formula (14). The imidazole compound (H) accelerates curing, and increases the glass transition temperature of the cured product.

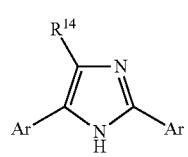

(14)

In the formula (14), Ar each independently represents a phenyl group, a naphthalene group, a biphenyl group, an anthracene group, or a hydroxyl-modified phenyl, naphthalene, biphenyl, or anthracene group; $R^{14}$ represents a hydrogen atom, an alkyl group or hydroxyl-modified alkyl group, or an aryl group such as a phenyl group.

In the formula (14), an imidazole substituent Ar represents a phenyl group, a naphthalene group, a biphenyl group, an anthracene group or hydroxyl-modified group thereof. Among these, a phenyl group is preferable. In the formula (14), an imidazole substituent represents a hydrogen atom, an alkyl or hydroxyl-modified alkyl group, or an aryl group such as a phenyl group. Among these, a phenyl group is preferable. Furthermore, it is more preferred that Ar and $R^{14}$ are both phenyl groups.

The imidazole compound (H) can be any imidazole compound, and 2,4,5-triphenylimidazole is preferable, for example. 2,4,5-Triphenylimidazole will improve the Tg of the cured product.

The resin composition according to one aspect of the present invention can contain the imidazole compound (H) in any content. When the maleimide compound (F) is not contained, the content is preferably 0.01 to 10 parts by mass, more preferably 0.1 to 5 parts by mass based on 100 parts by mass of the total of the halogen-free epoxy resin (B), the cyanic acid ester compound (C), and the phenol resin (D). When the maleimide compound (F) is contained, the content is preferably 0.01 to 10 parts by mass, more preferably 0.1 to 5 parts by mass based on 100 parts by mass of the total of the halogen-free epoxy resin (B), the cyanic acid ester compound (C), the phenol resin (D), and the maleimide compound (F), which is contained as an optional component.

The resin composition according to another aspect of the present invention can contain the imidazole compound (H) in any content. The content is preferably 0.01 to 5 parts by mass, more preferably 10 to 40 parts by mass based on 100 parts by mass of the total of the halogen-free epoxy resin (B) and the BT resin (G).

If the content of the imidazole compound (H) is within this range, the resin composition will attain higher curing properties, and the resulting cured product will have an improved glass transition temperature, lower water absorption, and lower elastic modulus.

(Other Curing Accelerators)

In the present embodiment, optional other curing accelerators can be used in combination with the imidazole compound (H). Examples of such a compound include, but should not be limited to, organic peroxides such as benzoyl peroxide, lauroyl peroxide, acetyl peroxide, parachlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, stearic acid lead, zinc naphthenate, zinc octylate, tin oleate, dibutyltin maleate, manganese naphthenate, cobalt naphthenate, and acetylacetone iron; these organic metal salts dissolved in hydroxyl group containing compounds such as phenol and bisphenol; inorganic metal salts such as tin chloride, zinc chloride, and aluminum chloride; and organic tin compounds such as dioctyltin oxide, alkyl tin and alkyl tin oxide other than dioctyltin.

(Solvent)

Furthermore, the resin composition according to the present embodiment may optionally contain a solvent. For example, an organic solvent will reduce viscosity during preparation of the resin composition to improve handling properties, and enhance the impregnation of the base material such as a glass cloth with the resin composition. Any solvent that can dissolve a mixture of the halogen-free epoxy resin (B), the cyanic acid ester compound (C), and/or the phenol resin (D), or a mixture of the halogen-free epoxy resin (B) and the BT resin (G) can be used. Specific examples thereof include, but should not be limited to, ketones such as acetone, methyl ethyl ketone, and methyl cellosolve; aromatic hydrocarbons such as toluene and xylene; amides such as dimethylformamide; and propylene glycolyl ether and acetate thereof. These solvents can be used singly or in combinations of two or more thereof.

The resin composition according to the present embodiment can be prepared according to a normal method. The resin composition can be prepared by any method which attains a resin composition uniformly containing the acrylic-silicone copolymer (A), the cyanic acid ester compound (B), and/or the phenol resin (C), the inorganic filler (D), and other optional components described above, or the acrylic-silicone copolymer (A), the BT resin (G), the inorganic filler (D), and other optional components described above. For example, the acrylic-silicone copolymer (A), the cyanic acid ester compound (B), and the inorganic filler (D) are sequentially compounded with a solvent, other components are properly compounded, and these are sufficiently stirred. Thereby, the resin composition according to the present embodiment can be readily prepared.

During the preparation of the resin composition according to the present embodiment, an organic solvent can be optionally used. Any organic solvent that can dissolve a mixture of the halogen-free epoxy resin (B), the cyanic acid ester compound (C), and/or the phenol resin (D) or a mixture of the halogen-free epoxy resin (B) and the BT resin (G) can be used. Specific examples thereof include those listed above.

During the preparation of the resin composition, the respective components can be uniformly dissolved or dispersed by a known method (such as stirring, mixing, and kneading). For example, to uniformly disperse the inorganic filler (E), the inorganic filler (E) is stirred and dispersed in a stirring tank equipped with a stirrer having a proper stirring ability, thereby enhancing the dispersibility of the inorganic filler (E) in the resin composition. The stirring, the mixing, and the kneading can be properly performed with a known apparatus, e.g., an apparatus for mixing such as a ball mill and a bead mill, or a revolving and/or rotary mixing apparatus.

[Prepreg]

The prepreg according to the present embodiment comprises a base material and the resin composition impregnated into or applied on the base material. The prepreg can be prepared by any normal method without limitation. For example, a base material is impregnated or coated with the resin composition according to the present embodiment, and is heated in a dryer at 100 to 200° C. for 1 to 30 minutes to semi-cure the composition (to transform into a B stage). Thereby, the prepreg according to the present embodiment can be prepared. The amount of the resin composition (including the inorganic filler) in the total amount of the prepreg according to the present embodiment is preferably 30 to 90% by mass, more preferably 30 to 80% by mass, but should not be limited to these.

For the base material used in the present embodiment, any known base material used in a variety of printed circuit board materials can be properly selected and used according to the target applications or performance. Specific examples thereof include, but should not be limited to, glass fibers such as E glass cloths, D glass cloths, S glass cloths, Q glass cloths, spherical glass cloths, NE glass cloths, and T glass cloths; inorganic fibers other than glass such as quartz; and organic fibers such as wholly aromatic polyamides such as polyparaphenyleneterephthalamide (Kevlar (registered trademark), available from E. I. du Pont de Nemours and Company), and copolyparaphenylene-3,4'-oxydiphenylene-.terephthalamide (Technora (registered trademark), available from Teijin Techno Products Limited), polyesters such as 2,6-hydroxynaphthoic acid.parahydroxybenzoic acid (Vectran (registered trademark), available from Kuraray Co., Ltd.), polyparaphenylenebenzoxazole (Zylon (registered trademark), available from TOYOBO CO., LTD.), and polyimides. Among these, E glass cloths, T glass cloths, S glass cloths, Q glass cloths, and organic fibers are preferable from the viewpoint of low thermal expansivity. These base materials can be used singly or in combination of two or more thereof.

The base material can have any form. Examples thereof include woven fabrics, non-woven fabrics, roving mats, chopped strand mats, and surfacing mats. The woven fabrics can be woven by known weaving methods such as plain weaving, basket weaving, and twill weaving. The method can be properly selected from these known methods according to the target applications and performance for use. The woven fabric subjected to opening and glass woven fabrics surface treated with a silane coupling agent are suitably used. The base material can has any thickness. The thickness is preferably about 0.01 to 0.3 mm. Especially from the viewpoint of strength and moisture absorbing properties, the base material is preferably a glass woven fabric having a thickness of 200 μm or less and a mass of 250 g/m$^2$ or less, and a glass woven fabric comprising E glass fibers is more preferable.

[Laminate]

The laminate according to the present embodiment includes one or more prepregs described above. The laminate can be any laminate including one or more prepregs, and may include any other layer. Usually, the laminate can be properly prepared by a known method without limitation. For example, the prepregs can be laminated to each other, and are molded under heating and pressure to prepare a laminate. At this time, the prepregs can be heated at any temperature. The heating temperature is preferably 65 to 300° C., more preferably 120 to 270° C. The pressure can be applied without limitation. The pressure is preferably 2 to 5 MPa, more preferably 2.5 to 4 MPa. The laminate according to the present embodiment, when including a layer of a metallic foil, can be suitably used as a metallic foil clad laminate described later.

[Metallic Foils Clad Laminate]

The metallic foil clad laminate according to the present embodiment comprises the prepreg, and a metallic foil laminated on one or both of the surfaces of the prepreg. Specifically, the metallic foil clad laminate according to the present embodiment can be prepared by: preparing one or more prepregs described above; disposing a metallic foil of copper or aluminum on one or both surfaces of the prepreg or the layered prepregs depending on the intended use; and lamination molding the resulting layered product, if desired. The metallic foil used here can be any metallic foil used as materials for printed circuit boards, and is preferably a known copper foil such as a rolled copper foil and an electrodeposited copper foil. The metallic foil can have any thickness. The thickness is preferably 2 to 70 μm, more preferably 2 to 35 μm. The metallic foil clad laminate can be molded by any method under any molding condition. A standard method and standard conditions applied to laminates and multi-layer plates for printed circuit boards can be used. For example, the metallic foil clad laminate can be molded with a multi-stage press machine, a multi-stage vacuum press machine, a continuous molding machine, or an autoclave molding machine, typically under the conditions of the temperature in the range of 100 to 300° C., the pressure in the range of 2 to 100 kgf/cm$^2$ in terms of planar pressure, and the heating time in the range of 0.05 to 5 hours. Optionally, post-curing can be performed at a temperature of 150 to 300° C. Alternatively, the prepreg according to the present embodiment in combination with a circuit board or an inner layer separately prepared can be lamination molded to prepare multi-layer plates.

The metallic foil clad laminate according to the present embodiment can be suitably used as a printed circuit board described later by forming a predetermined wiring pattern on it. The metallic foil clad laminate according to the present embodiment has a small coefficient of thermal expansion, high moldability, and high resistance against chemicals, and thus can be particularly effectively used in printed circuit boards for semiconductor packages which require such high performance.

[Printed Circuit Board]

The printed circuit board according to the present embodiment comprises an insulating layer and a conductive layer disposed on a surface of the insulating layer. The insulating layer comprises the resin composition. The printed circuit board according to the present embodiment can be prepared by the following method, for example. First, a metallic foil clad laminate such as a copper clad laminate is prepared. The surface of the metallic foil clad laminate is etched to form an inner layer circuit to prepare an inner layer base material. The surface of the inner layer circuit of the inner layer base material is optionally surface treated to enhance adhesive strength. Then, the required number of the prepregs according to the present embodiment is/are layered on the surface of the inner layer circuit. A metallic foil or an outer layer circuit is further laminated on the outer side of the layered prepreg. The resulting laminate is molded into one by heating under pressure. Thus, a multi-layered metallic foil clad laminate is prepared, in which the base material and the insulating layer formed of a cured product of the thermosetting resin composition are disposed between the inner layer circuit and the metallic foil or an outer layer circuit. Next, this multi-layer metallic foil clad laminate is drilled for formation of through holes and via holes, and is desmeared to remove smears, i.e., residues of the resin derived from the resin component contained in the cured product layer. Subsequently, a plated metal coating is formed on the wall surfaces of the holes to electrically connect the inner layer circuit to the metallic foil or an outer layer circuit. Furthermore, the metallic foil or an outer layer circuit is etched to form an outer layer circuit. Thus, a printed circuit board is prepared.

In this embodiment, the prepreg according to the present embodiment (a base material and the resin composition according to the present embodiment impregnated into or applied on the base material) and the resin composition layer (the layer formed of the resin composition according to the present embodiment) of the metallic foil clad laminate serve as an insulating layer containing the resin composition.

EXAMPLES

The present invention will now be described in detail by way of Synthesis Examples, Examples and Comparative Examples, but the present invention will not be limited to these Examples.

Synthesis Example 1 Synthesis of α-Naphtholaralkyl-Based Cyanic Acid Ester Resin A reactor provided with a thermometer, a stirrer, a dropping funnel, and a reflux cooler was preliminarily cooled with brine to 0 to 5° C. Cyanogen chloride (7.47 g, 0.122 mol), 35% hydrochloric acid (9.75 g, 0.0935 mol), water (76 mL), and methylene chloride (44 mL) were placed in the reactor.

While the reactor was kept at an inner temperature of −5 to +5° C. and a pH of 1 or less, a solution prepared by dissolving α-naphtholaralkyl-based phenol resin, which corresponded to the formula (11) in which all of the $R^{11}$s were hydrogen atoms, (SN485, OH group equivalent: 214 g/eq., softening point: 86° C., available from NIPPON STEEL & SUMIKIN CHEMICAL CO., LTD.) (20 g, 0.0935 mol) and triethylamine (14.16 g, 0.14 mol) in methylene chloride (92 mL) was added dropwise with the dropping funnel over 1 hour under stirring. After the dropping was completed, triethylamine (4.72 g, 0.047 mol) was additionally added dropwise over 15 minutes.

After dropping of triethylamine was completed, the reaction solution was stirred at the same temperature for 15 minutes. The reaction solution was separated to extract an organic layer. The extracted organic layer was washed with water (100 mL) twice. Methylene chloride was distilled off from the organic layer with an evaporator under reduced pressure. The product was finally condensed, was dried, and was solidified at 80° C. for 1 hour to prepare a cyanic acid ester compound of the α-naphtholaralkyl-based phenol resin (α-naphtholaralkyl-based cyanic acid ester resin, 23.5 g).

Synthesis Example 2 Synthesis of BT Resin 1

The α-naphtholaralkyl-based cyanic acid ester resin prepared in Synthesis Example 1 (cyanate equivalent: 261 g/eq., 36 parts by mass) and a maleimide compound, which corresponded to the formula (13) in which all of the $R^{13}$s were hydrogen atoms and n was 0 to 1, (BMI-2300, available from Daiwakasei Industry Co., Ltd., 24 parts by mass) were dissolved in dimethylacetamide, and were reacted with stirring at 150° C. to prepare BT resin 1.

Synthesis Example 3 Synthesis of BT Resin 2

The α-naphtholaralkyl-based cyanic acid ester resin prepared in Synthesis Example 1 (cyanate equivalent: 261 g/eq., 30 parts by mass) and the maleimide compound used in Synthesis Example 2 (BMI-2300, 30 parts by mass) were dissolved in dimethylacetamide, and were reacted with stirring at 150° C. to prepare BT resin 2.

Example 1

An acrylic-silicone copolymer (R-170 S, average particle size: 30 μm, average primary particle size: 0.2 to 0.3 μm, available from Nissin Chemical Industry Co., Ltd., 25 parts by mass), a phenol biphenylaralkyl-based epoxy resin, which corresponded to the formula (3) in which all of the $R^4$s were hydrogen atoms, (NC-3000-FH, epoxy equivalent:

320 g/eq., available from NIPPON KAYAKU Co., Ltd., 49 parts by mass), a naphtholaralkyl-based phenol resin, which corresponded to the formula (11) in which all of the $R^{11}$s were hydrogen atoms, (SN-495, available from NIPPON STEEL & SUMIKIN CHEMICAL CO., LTD., hydroxyl group equivalent: 236 g/eq., 36 parts by mass), bis(3-ethyl-5-methyl-4-maleimidephenyl)methane (BMI-70, K-I Chemical Industry Co., Ltd., 15 parts by mass), a silane coupling agent (available from Dow Corning Toray Co., Ltd., 5 parts by mass), Wet dispersant 1 (disperbyk-161, available from BYK Japan K.K., 1 part by mass), spherical fused silica (SC2500-SQ, particle size: 0.5 μm, available from Admatechs Company Limited, 200 parts by mass), and 2-ethyl-4-methylimidazole (2E4MZ, available from SHIKOKU CHEMICALS CORPORATION, 0.02 parts by mass) were mixed to prepare a varnish. The varnish was diluted with methyl ethyl ketone, and was applied to a Q glass woven fabric having a thickness of 0.1 mm by impregnation. The fabric impregnated with vanish was dried by heating at 140° C. for 3 minutes to prepare a prepreg having a resin content of 50% by mass.

Example 2

An acrylic-silicone copolymer (R-170S) used in Example 1 (25 parts by mass), a polyoxynaphthylene-based epoxy resin (HP-6000, available from DIC Corporation, epoxy equivalent: 250 g/eq., 44 parts by mass), the biphenylaralkyl-based phenol resin, which corresponded to Formula (12) in which all of the $R^{12}$s were hydrogen atoms, (KAYAHARD GPH-103, available from NIPPON KAYAKU Co., Ltd., hydroxyl group equivalent: 231 g/eq., 18 parts by mass), a naphthalene-based phenol resin (EPICLON EXB-9500, available from DIC Corporation, hydroxyl group equivalent: 153 g/eq., 18 parts by mass), an aminotriazine novolac resin (PHENOLITE LA-3018-50P, hydroxyl group equivalent: 151 g/eq., available from DIC Corporation, 3 parts by mass), bis(3-ethyl-5-methyl-4-maleimidephenyl)methane (BMI-70) (17 parts by mass), a silane coupling agent (Z6040, available from Dow Corning Toray Co., Ltd., 5 parts by mass), and Wet dispersant 1 (disperbyk-161, 1 part by mass), spherical fused silica (SC2500-SQ, 200 parts by mass), and an imidazole compound (2E4MZ, 0.02 parts by mass) used in Example 1 were mixed to prepare a varnish. The varnish was diluted with methyl ethyl ketone, and was applied to a Q-glass woven fabric having a thickness of 0.1 mm by impregnation. The fabric was dried by heating at 140° C. for 3 minutes to prepare a prepreg having a resin content of 50% by mass.

Example 3

A prepreg was prepared by the same operation as in Example 2 except that the acrylic-silicone copolymer used in Example 2 was replaced with an acrylic-silicone copolymer having a different average particle size (R-170S, average particle size: 20 μm, average primary particle size: 0.2 to 0.3 μm, available from Nissin Chemical Industry Co., Ltd., 25 parts by mass).

Example 4

A prepreg was prepared by the same operation as in Example 3 except that bis(3-ethyl-5-methyl-4-maleimidephenyl)methane (BMI-70) was replaced with the maleimide compound used in Synthesis Example 2 (BMI-2300, 17 parts by mass).

Example 5

An acrylic-silicone copolymer used in Example 2 (25 parts by mass), a polyoxynaphthylene-based epoxy resin (HP-6000) (60 parts by mass), the α-naphtholaralkyl-based cyanic acid ester resin prepared in Synthesis Example 1 (cyanate equivalent: 261 g/eq., 40 parts by mass), a silane coupling agent (Z6040, 5 parts by mass), Wet dispersant 1 (disperbyk-161, 1 part by mass), Wet dispersant 2 (disperbyk-111, available from BYK Japan K.K., 2 parts by mass), and spherical fused silica (SC2500-SQ, 200 parts by mass) were mixed to prepare a varnish. The varnish was diluted with methyl ethyl ketone, and was applied to a Q-glass woven fabric having a thickness of 0.1 mm by impregnation. The fabric was dried by heating at 140° C. for 3 minutes to prepare a prepreg having a resin content of 50% by mass.

Example 6

A prepreg was prepared by the same operation as in Example 5 except that the α-naphtholaralkyl-based cyanic acid ester resin was replaced with the prepolymer of 2,2-bis(4-cyanate phenyl)propane (CA210, cyanate equivalent: 139, available from MITSUBISHI GAS CHEMICAL COMPANY, INC., 40 parts by mass).

Example 7

A prepreg was prepared by the same operation as in Example 5 except that the α-naphtholaralkyl-based cyanic acid ester resin was replaced with novolac-based cyanic acid ester resin, which corresponded to Formula (9) in which all of the $R^9$s were hydrogen atoms, (PrimasetPT-30, available from Lonza Japan Ltd., cyanate equivalent: 124 g/eq., 40 parts by mass).

Example 8

An acrylic-silicone copolymer used in Example 2 (25 parts by mass), a polyoxynaphthylene-based epoxy resin (HP-6000, 38 parts by mass), α-naphtholaralkyl-based cyanic acid ester resin prepared in Synthesis Example 1 (cyanate equivalent: 261 g/eq., 36 parts by mass), a maleimide compound used in Synthesis Example 2 (BMI-2300, 26 parts by mass), a silane coupling agent (Z6040, 5 parts by mass), Wet dispersant 1 (disperbyk-161, 1 part by mass), Wet dispersant 2 (disperbyk-111, 2 parts by mass), and spherical fused silica (SC2500-SQ, 200 parts by mass) were mixed to prepare a varnish. The varnish was diluted with methyl ethyl ketone, and was applied to a Q-glass woven fabric having a thickness of 0.1 mm by impregnation. The fabric was dried by heating at 140° C. for 3 minutes to prepare a prepreg having a resin content of 50% by mass.

Example 9

A prepreg was prepared by the same operation as in Example 8 except that the maleimide compound used in Synthesis Example 2 (BMI-2300) was replaced with bis(3-ethyl-5-methyl-4-maleimidephenyl)methane used in Example 1 (BMI-70, 26 parts by mass).

Example 10

A prepreg was prepared by the same operation as in Example 8 except that the polyoxynaphthylene-based epoxy resin (HP-6000) was replaced with the phenol biphenylaralkyl-based epoxy resin used in Example 1 (NC-3000-FH, 38 parts by mass).

Example 11

A prepreg was prepared by the same operation as in Example 8 except that that the phenol biphenylaralkyl-based epoxy resin used in Example 10 (NC-3000-FH) was replaced with a naphthalene modified epoxy resin (ESN-175V, epoxy equivalent: 255 g/eq., available from NIPPON STEEL & SUMIKIN CHEMICAL CO., LTD., 38 parts by mass).

Example 12

A prepreg was prepared by the same operation as in Example 8 except that the polyoxynaphthylene-based epoxy resin (HP-6000) was replaced with a phenol phenyl aralkyl novolac-based epoxy resin, which corresponded to Formula (2) in which all of the $R^3$s were hydrogen atoms (NC-2000-L, epoxy equivalent: 226 g/eq., available from NIPPON KAYAKU Co., Ltd., 38 parts by mass).

Example 13

A prepreg was prepared by the same operation as in Example 8 except that 2-ethyl-4-methylimidazole (2E4MZ, 0.01 parts by mass) was additionally added, during the preparation of the varnish.

Example 14

A prepreg was prepared by the same operation as in Example 8 except that the α-naphtholaralkyl-based cyanic acid ester resin prepared in Synthesis Example 1 and the maleimide compound used in Synthesis Example 2 were replaced with BT resin 1 prepared in Synthesis Example 2 (62 parts by mass).

Example 15

A prepreg was prepared by the same operation as in Example 8 except that the α-naphtholaralkyl-based cyanic acid ester resin prepared in Synthesis Example 1 and a maleimide compound used in Synthesis Example 2 were replaced with BT resin 2 prepared in Synthesis Example 3 (62 parts by mass) was added.

Example 16

A prepreg was prepared by the same operation as in Example 14 except that the addition amount of BT resin 1 prepared in Synthesis Example 2 was changed to 59 parts by mass, and a naphtholaralkyl-based phenol resin (SN-495, 3 parts by mass) was additionally added.

Comparative Example 1

A prepreg was prepared by the same operation as in Example 2 except that the acrylic-silicone copolymer was not used.

Comparative Example 2

A prepreg was prepared by the same operation as in Example 2 except that the acrylic-silicone copolymer was replaced with silicone rubber powder whose surface was coated with a silicone resin (silicone composite powder X-52-7030, available from Shin-Etsu Chemical Co., Ltd., 25 parts by mass).

Comparative Example 3

A prepreg was prepared by the same operation as in Example 2 except that the acrylic-silicone copolymer was replaced with silicone rubber powder whose surface was coated with a silicone resin (silicone composite powder KPM-605M, available from Shin-Etsu Chemical Co., Ltd., 25 parts by mass).

Comparative Example 4

A prepreg was prepared by the same operation as in Example 2 except that the acrylic-silicone copolymer was replaced with silicone elastomer (EP-2600, available from Dow Corning Toray Co., Ltd., 25 parts by mass).

Comparative Example 5

A prepreg was prepared by the same operation as in Example 2 except that the acrylic-silicone copolymer was replaced with silicone elastomer (EP-2601, available from Dow Corning Toray Co., Ltd., 25 parts by mass).

Comparative Example 6

A prepreg was prepared by the same operation as in Example 2 except that the acrylic-silicone copolymer was replaced with silicone elastomer (EP-2720, available from Dow Corning Toray Co., Ltd., 25 parts by mass).

Comparative Example 7

A prepreg was prepared by the same operation as in Example 2 except that the acrylic-silicone copolymer was replaced with silicone elastomer (TORAYFIL E-606, available from Dow Corning Toray Co., Ltd., 25 parts by mass).

Comparative Example 8

A prepreg was prepared by the same operation as in Example 8 except that the acrylic-silicone copolymer was replaced with silicone rubber powder whose surface was coated with a silicone resin (silicone composite powder X-52-7030, available from Shin-Etsu Chemical Co., Ltd., 25 parts by mass).

Comparative Example 9

A prepreg was prepared by the same operation as in Example 8 except that the acrylic-silicone copolymer was replaced with silicone rubber powder whose surface was coated with a silicone resin (silicone composite powder KMP-605M, available from Shin-Etsu Chemical Co., Ltd., 25 parts by mass).

Comparative Example 10

A prepreg was prepared by the same operation as in Example 8 except that the acrylic-silicone copolymer was replaced with silicone elastomer (EP-2600, available from Dow Corning Toray Co., Ltd., 25 parts by mass).

Comparative Example 11

A prepreg was prepared by the same operation as in Example 8 except that the acrylic-silicone copolymer was replaced with silicone elastomer (EP-2601, available from Dow Corning Toray Co., Ltd., 25 parts by mass).

Comparative Example 12

A prepreg was prepared by the same operation as in Example 8 except that the acrylic-silicone copolymer was replaced with silicone elastomer (EP-2720, available from Dow Corning Toray Co., Ltd., 25 parts by mass).

Comparative Example 13

A prepreg was prepared by the same operation as in Example 8 except that the acrylic-silicone copolymer was replaced with silicone elastomer (TORAYFIL E-606, available from Dow Corning Toray Co., Ltd., 25 parts by mass).

[Preparation of Copper Clad Laminates]

Two prepregs prepared in each of Examples 1 to 16 and Comparative Examples 1 to 13 were layered to form a laminate. An electrodeposited copper foil having a thickness of 12 μm (3EC-III, available from Mitsui Mining & Smelting Co., Ltd.) was disposed on both sides of the laminate. The layered product was lamination molded at a pressure of 30 kgf/cm$^2$, a temperature of 220° C. for 120 minutes to prepare a copper clad laminate including an insulating layer having a thickness of 0.2 mm.

The moldability, the resistances against desmearing, and the coefficients of thermal expansion in the planar direction of the copper clad laminates were evaluated. The results are shown in Tables 1 and 2.

[Method of Evaluating Physical Properties of Copper Clad Laminate]

The moldability, the heat resistance, and the coefficient of thermal expansion in the planar direction were evaluated by the following methods.

(Moldability)

After the copper foil of a copper clad laminate was removed by etching, the surface of the laminate after removal of the copper foil was observed to determine the presence or absence of voids. The moldability were evaluated based on the presence or absence of voids.

(Resistance Against Chemicals)

To evaluate the resistance against chemicals in the desmearing step, the copper foil of a copper clad laminate was removed by etching, and the mass of the obtained laminate was measured. Subsequently, the laminate was immersed in a swelling solution SWELLING DIP SECURIGANTH P available from Atotech Japan K.K. at 80° C. for 10 minutes, then in a roughening solution CONCENTRATE COMPACT CP available from Atotech Japan K.K. at 80° C. for 5 minutes, and finally in a neutralization solution REDUCTION CONDITIONER SECURIGANTH P500 available from Atotech Japan K.K. at 45° C. for 10 minutes. After this treatment was performed three times, the mass of the laminate was measured. The reduced amount of the mass of the laminate before and after the treatment (wt %) was calculated. From the reduced amount, the resistance against chemicals was evaluated.

(Coefficient of Thermal Expansion in Planar Direction)

The copper foil of the copper clad laminate was removed by etching, and the remaining laminate was heated with a thermomechanical analyzer (available from TA Instruments-Waters Corporation LLC) at 10° C./min from 40° C. to 340° C. to measure the coefficient of linear expansion in the planar direction from 60° C. to 120° C. The direction for measurement was the longitudinal direction (Warp) of the glass cloth of the laminate.

TABLE 1

|  | Example 1 | Example 2 | Example 3 | Example 4 | Example 5 | Example 6 | Example 7 | Example 8 |
|---|---|---|---|---|---|---|---|---|
| Moldability | ○ | ○ | ○ | ○ | ○ | ○ | ○ | ○ |
| Resistance against chemicals | −1.7 | −1.7 | −1.6 | −1.7 | −1.4 | −1.6 | −1.8 | −1.6 |
| Coefficient of thermal expansion | 1.6 | 1.5 | 1.4 | 1.7 | 1.6 | 1.7 | 1.8 | 1.5 |

|  | Example 9 | Example 10 | Example 11 | Example 12 | Example 13 | Example 14 | Example 15 | Example 16 |
|---|---|---|---|---|---|---|---|---|
| Moldability | ○ | ○ | ○ | ○ | ○ | ○ | ○ | ○ |
| Resistance against chemicals | −1.6 | −1.6 | −1.5 | −1.6 | −1.7 | −1.7 | −1.8 | −1.6 |
| Coefficient of thermal expansion | 1.7 | 1.8 | 1.7 | 1.8 | 1.5 | 1.5 | 1.5 | 1.6 |

Moldability ○: no void was confirmed X: presence of voids was confirmed
Units
Resistance against chemicals: wt %
coefficient of thermal expansion: ppm/° C.

TABLE 2

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Moldability | ○ | X | ○ | ○ | ○ | ○ | ○ | X |
| Resistance against | −1.2 | −1.7 | −1.9 | −2.3 | −1.9 | −2.1 | −2.4 | −1.8 |

TABLE 2-continued

| chemicals | | | | | | | | |
|---|---|---|---|---|---|---|---|---|
| Coefficient of thermal expansion | 3.5 | 1.5 | 2.0 | 2.0 | 2.1 | 2.0 | 2.1 | 1.6 |

| | Comparative Example 9 | Comparative Example 10 | Comparative Example 11 | Comparative Example 12 | Comparative Example 13 |
|---|---|---|---|---|---|
| Moldability | ○ | ○ | ○ | ○ | ○ |
| Resistance against chemicals | −1.8 | −2.2 | −1.8 | −2.0 | −2.3 |
| Coefficient of thermal expansion | 2.2 | 2.1 | 2.1 | 2.1 | 2.2 |

Moldability ○: no void was confirmed X: presence of voids was confirmed
Units
Resistance against chemicals: wt %
Coefficient of thermal expansion: ppm/° C.

This application is based on Japanese Patent Application No. 2012-260236, filed with the Japan Patent Office on Nov. 28, 2012, the contents of which are incorporated herein by reference.

INDUSTRIAL APPLICABILITY

The resin composition according to the present invention has industrial applicability as a resin composition used in preparation of prepregs used in metallic foil clad laminates and printed circuit boards etc.

The invention claimed is:
1. A resin composition, comprising:
an acrylic-silicone copolymer (A);
a halogen-free epoxy resin (B);
a cyanic acid ester compound (C) optionally, a phenol resin (D); and
an inorganic filler (E),
wherein the acrylic-silicone copolymer (A) comprises aggregates of fine particles, the fine particles having an average particle size of 0.10 to 1.0 μm, and the aggregates having an average particle size of 20 to 400 μm.
2. The resin composition according to claim 1, wherein the halogen-free epoxy resin (B) comprises one or more selected from the group consisting of phenol phenyl aralkyl novolac-based epoxy resins represented by the following formula (2), phenol biphenylaralkyl-based epoxy resins represented by the following formula (3), naphtholaralkyl-based epoxy resins represented by the following formula (4), anthraquinone-based epoxy resins represented by the following formula (5), and polyoxynaphthylene-based epoxy resins represented by the following formula (6) or (7):

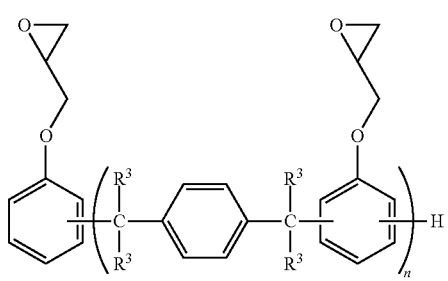

(2)

wherein $R^3$ each independently represents a hydrogen atom or a methyl group; and n represents an integer of 1 or more;

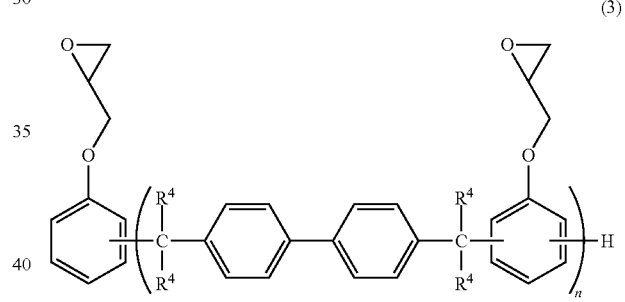

(3)

wherein $R^4$ each independently represents a hydrogen atom or a methyl group; and n represents an integer of 1 or more;

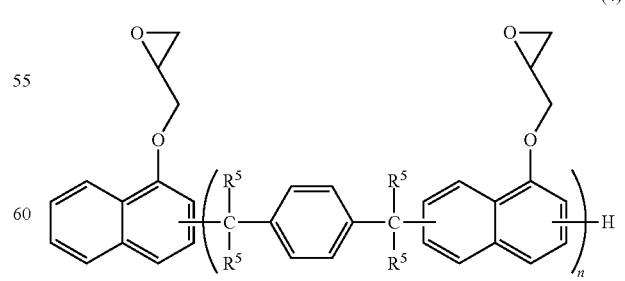

(4)

wherein $R^5$ each independently represents a hydrogen atom or a methyl group; and n represents an integer of 1 or more;

(5)

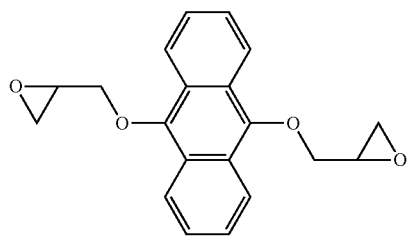

(6)

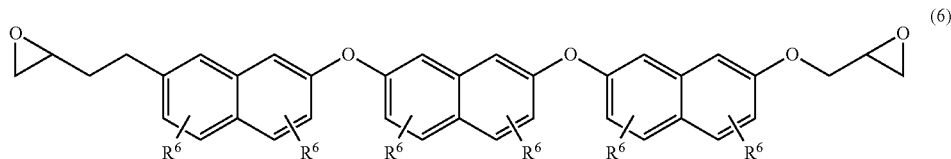

wherein R⁶ each independently represents a hydrogen atom, an alkyl group having 1 to 4 carbon atoms, or an aralkyl group;

(7)

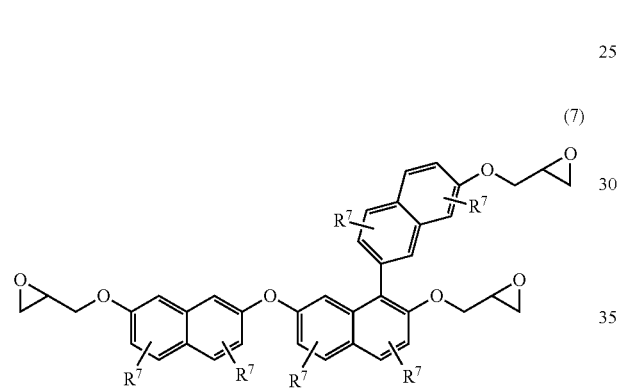

wherein R⁷ each independently represents a hydrogen atom, an alkyl group having 1 to 4 carbon atoms, or an aralkyl group.

3. The resin composition according to claim 1, wherein the cyanic acid ester compound (C) comprises one or more selected from the group consisting of naphtholaralkyl-based cyanic acid ester compounds represented by following formula (8), novolac-based cyanic acid ester compounds represented by the following formula (9), and biphenylaralkyl-based cyanic acid ester compounds represented by the following formula (10):

(8)

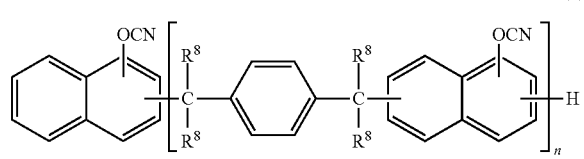

wherein R⁸ each independently represents a hydrogen atom or a methyl group; and n represents an integer of 1 or more;

(9)

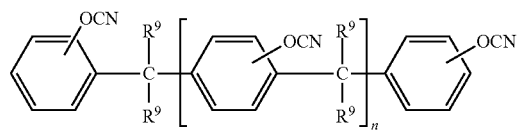

wherein R⁹ each independently represents a hydrogen atom or a methyl group; and n represents an integer of 1 or more;

(10)

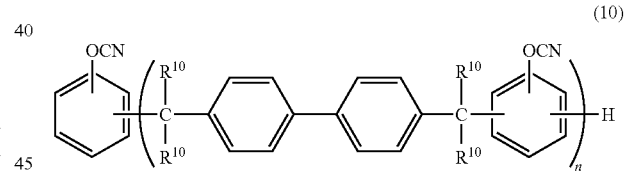

wherein R¹⁰ each independently represents a hydrogen atom or a methyl group; and n represents an integer of 1 or more.

4. The resin composition according to claim 1, wherein the phenol resin (D) comprises one or more selected from the group consisting of cresol novolac-based phenol resins, naphtholaralkyl-based phenol resins, biphenylaralkyl-based phenol resins, aminotriazine novolac-based phenol resins, and naphthalene-based phenol resins.

5. The resin composition according to claim 1, further comprising a maleimide compound (F).

6. The resin composition according to claim 5, wherein the maleimide compound (F) comprises a compound represented by the following formula (13):

(13)

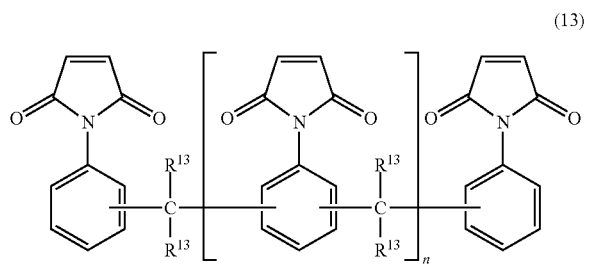

wherein $R^{13}$ each independently represents a hydrogen atom or a methyl group; and n represents an integer of 1 or more.

7. The resin composition according to claim 5, wherein a content of the acrylic-silicone copolymer (A) is:
3 to 50 parts by mass based on 100 parts by mass of a total of the halogen-free epoxy resin (B), the cyanic acid ester compound (C), the phenol resin (D), and the maleimide compound (F).

8. The resin composition according to claim 5, wherein a content of the halogen-free epoxy resin (B) is:
5 to 60 parts by mass based on 100 parts by mass of the total of the halogen-free epoxy resin (B), the cyanic acid ester compound (C), the phenol resin (D), and the maleimide compound (F).

9. The resin composition according to claim 5, wherein a total content of the cyanic acid ester compound (C) and the phenol resin (D) is:
10 to 50 parts by mass based on 100 parts by mass of the total of the halogen-free epoxy resin (B), the cyanic acid ester compound (C), the phenol resin (D), and the maleimide compound (F).

10. The resin composition according to claim 5, wherein the content of the inorganic filler (E) is:
50 to 500 parts by mass based on 100 parts by mass of the total of the halogen-free epoxy resin (B), the cyanic acid ester compound (C), the phenol resin (D), and the maleimide compound (F).

11. The resin composition according to claim 5, wherein a content of the maleimide compound (F) is 3 to 50 parts by mass based on 100 parts by mass of the total of the halogen-free epoxy resin (B), the cyanic acid ester compound (C), the phenol resin (D), and the maleimide compound (F).

12. The resin composition according to claim 1, wherein a content of the acrylic-silicone copolymer (A) is:
3 to 50 parts by mass based on 100 parts by mass of a total of the halogen-free epoxy resin (B), the cyanic acid ester compound (C), and the phenol resin (D).

13. The resin composition according to claim 1, wherein a content of the halogen-free epoxy resin (B) is:
5 to 60 parts by mass based on 100 parts by mass of the total of the halogen-free epoxy resin (B), the cyanic acid ester compound (C), and the phenol resin (D).

14. The resin composition according to claim 1, wherein a total content of the cyanic acid ester compound (C) and the phenol resin (D) is:
10 to 50 parts by mass based on 100 parts by mass of the total of the halogen-free epoxy resin (B), the cyanic acid ester compound (C), and the phenol resin (D).

15. The resin composition according to claim 1, wherein the content of the inorganic filler (E) is:
50 to 500 parts by mass based on 100 parts by mass of the total of the halogen-free epoxy resin (B), the cyanic acid ester compound (C), and the phenol resin (D).

16. A resin composition, comprising:
an acrylic-silicone copolymer (A);
a halogen-free epoxy resin (B);
a BT resin (G) prepared by forming a cyanic acid ester compound (C) and a maleimide compound (F) into a prepolymer; and
an inorganic filler (E),
wherein the acrylic-silicone copolymer (A) comprises aggregates of fine particles, the fine particles having an average particle size of 0.10 to 1.0 μm, and the aggregates having an average particle size of 20 to 400 μm.

17. The resin composition according to claim 16, wherein the cyanic acid ester compound (C) comprises one or more selected from the group consisting of naphtholaralkyl-based cyanic acid ester compounds represented by the following formula (8), novolac-based cyanic acid ester compounds represented by the following formula (9), and biphenylaralkyl-based cyanic acid ester compounds represented by the following formula (10):

(8)

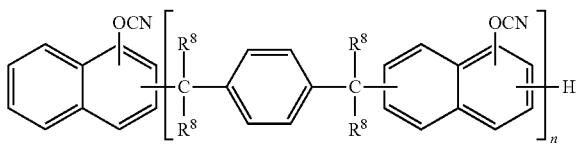

wherein $R^8$ each independently represents a hydrogen atom or a methyl group; and n represents an integer of 1 or more;

(9)

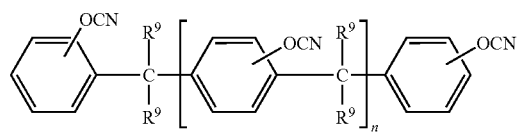

wherein $R^9$ each independently represents a hydrogen atom or a methyl group; and n represents an integer of 1 or more;

(10)

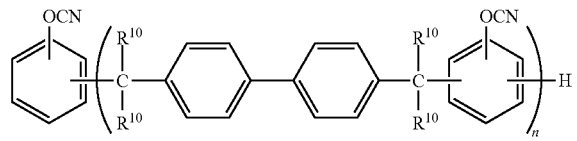

wherein $R^{10}$ each independently represents a hydrogen atom or a methyl group; and n represents an integer of 1 or more.

18. The resin composition according to claim 16, wherein the maleimide compound (F) comprises a compound represented by the following formula (13):

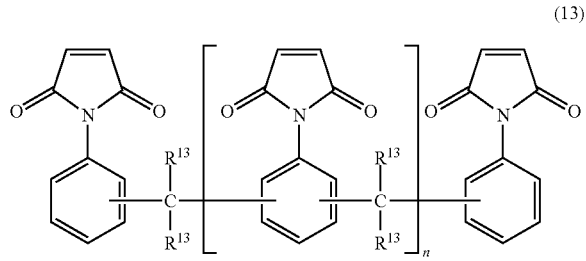

(13)

wherein $R^{13}$ each independently represents a hydrogen atom or a methyl group; and n represents an integer of 1 or more.

19. The resin composition according to claim 16, wherein a content of the acrylic-silicone copolymer (A) is 3 to 50 parts by mass based on 100 parts by mass of a total of the halogen-free epoxy resin (B) and the BT resin (G).

20. The resin composition according to claim 16, wherein a content of the halogen-free epoxy resin (B) is 5 to 60 parts by mass based on 100 parts by mass of the total of the halogen-free epoxy resin (B) and the BT resin (G).

21. The resin composition according to claim 16, wherein a content of the BT resin (G) is 20 to 80 parts by mass based on 100 parts by mass of the total of the halogen-free epoxy resin (B) and the BT resin (G).

22. The resin composition according to claim 16, wherein the content of the inorganic filler (E) is 50 to 400 parts by mass based on 100 parts by mass of the total of the halogen-free epoxy resin (B) and the BT resin (G).

23. The resin composition according to claim 1, further comprising an imidazole compound (H) represented by the following formula (14):

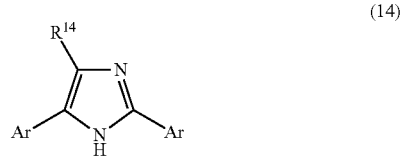

(14)

wherein Ar each independently represents a phenyl group, a naphthalene group, a biphenyl group, an anthracene group, or a hydroxyl-modified phenyl, naphthalene, biphenyl or anthracene group; and $R^{14}$ represents a hydrogen atom, an alkyl group or hydroxyl-modified alkyl group, or an aryl group.

24. The resin composition according to claim 23, wherein the imidazole compound (H) comprises 2,4,5-triphenylimidazole.

25. The resin composition according to claim 1, wherein the inorganic filler (E) comprises silica and/or boehmite.

26. A prepreg, comprising:
a base material, and
the resin composition according to claim 1 impregnated into or applied on the base material.

27. The prepreg according to claim 26, wherein the base material comprises one or more selected from the group consisting of E glass cloths, T glass cloths, S glass cloths, Q glass cloths, and organic fibers.

28. A laminate, comprising at least one of the prepregs according to claim 26.

29. A metallic foil clad laminate, comprising:
the prepreg according to claim 26; and
a metallic foil disposed on one or both of the surfaces of the prepreg.

30. A printed circuit board, comprising an insulating layer, and a conductive layer disposed on a surface of the insulating layer wherein the insulating layer comprises the resin composition according to any one of claim 1.

31. The resin composition according to claim 16, further comprising an imidazole compound (H) represented by the following formula (14):

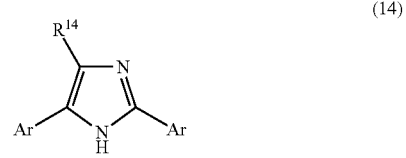

(14)

wherein Ar each independently represents a phenyl group, a naphthalene group, a biphenyl group, an anthracene group, or a hydroxyl-modified phenyl, naphthalene, biphenyl or anthracene group; and $R^{14}$ represents a hydrogen atom, an alkyl group or hydroxyl-modified alkyl group, or an aryl group.

32. The resin composition according to claim 31, wherein the imidazole compound (H) comprises 2,4,5-triphenylimidazole.

33. The resin composition according to claim 16, wherein the inorganic filler (E) comprises silica and/or boehmite.

34. A prepreg, comprising:
a base material, and
the resin composition according to claim 16 impregnated into or applied on the base material.

35. The prepreg according to claim 34, wherein the base material comprises one or more selected from the group consisting of E glass cloths, T glass cloths, S glass cloths, Q glass cloths, and organic fibers.

36. A laminate, comprising at least one of the prepregs according to claim 34.

37. A metallic foil clad laminate, comprising:
the prepreg according to claim 30; and
a metallic foil disposed on one or both of the surfaces of the prepreg.

38. A printed circuit board, comprising an insulating layer, and a conductive layer disposed on a surface of the insulating layer,
wherein the insulating layer comprises the resin composition according to claim 16.

* * * * *